(12) United States Patent
Motoyama

(10) Patent No.: US 12,549,148 B2
(45) Date of Patent: Feb. 10, 2026

(54) FILTER APPARATUS

(71) Applicant: Murata Manufacturing Co., Ltd., Nagaokakyo (JP)

(72) Inventor: Hiroto Motoyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 121 days.

(21) Appl. No.: 18/429,608

(22) Filed: Feb. 1, 2024

(65) Prior Publication Data

US 2024/0283420 A1 Aug. 22, 2024

(30) Foreign Application Priority Data

Feb. 17, 2023 (JP) ................. 2023-023294

(51) Int. Cl.
*H03H 7/01* (2006.01)
*H01F 17/00* (2006.01)
(Continued)

(52) U.S. Cl.
CPC ....... *H03H 7/0115* (2013.01); *H01F 17/0013* (2013.01); *H01F 27/292* (2013.01); *H01G 4/30* (2013.01)

(58) Field of Classification Search
CPC ................. H03H 7/0115; H03H 7/075; H03H 2001/0085; H03H 7/09; H03H 7/1708; H03H 7/1775; H03H 1/00; H03H 7/1791; H03H 7/1725; H03H 7/01; H03H 7/42; H03H 7/1741; H03H 9/6489; H03H 7/0123; H03H 7/1758; H03H 9/25; H03H 1/0007; H03H 7/0138; H03H 7/0161; H03H 7/12; H03H 7/46; H03H 7/463; H03H 9/0009; H03H 9/0057; H03H 9/46; H03H 9/52; H03H 9/64; H03H 9/6423; H03H 9/6433; H03H 9/6479; H03H 9/6483; H03H 9/725; H03H 2001/0014; H03H 7/03;
(Continued)

(56) References Cited

U.S. PATENT DOCUMENTS

2019/0007018 A1* 1/2019 Ashida ................ H03H 7/0138
2022/0077835 A1* 3/2022 Motoyama ............... H01G 4/40
(Continued)

FOREIGN PATENT DOCUMENTS

JP 2008-167157 A 7/2008
WO 2021241103 A1 12/2021

*Primary Examiner* — John W Poos
(74) *Attorney, Agent, or Firm* — Keating & Bennett, LLP

(57) ABSTRACT

A filter apparatus includes input and output terminals, a ground terminal, a ground electrode connected to the ground terminal, a plate electrode, and first to four lines. A multilayer body of the filter includes a first and second main surface. The input and output terminals and the ground terminal are provided on the second main surface. The plate electrode is closer to the first main surface than the ground electrode. The first line is electrically connected to the input terminal and the plate electrode. The second line is electrically connected to the output terminal and the plate electrode. The first line is capacitively coupled to the second line. When the multilayer body is viewed in a plan view from a layering direction, the plate electrode covers a portion of a space providing capacitive coupling between the first line and the second line.

19 Claims, 22 Drawing Sheets

(51) Int. Cl.
*H01F 27/29* (2006.01)
*H01G 4/30* (2006.01)

(58) Field of Classification Search
CPC ............. H03H 7/1766; H03H 9/02228; H03H 9/02559; H03H 9/02574; H03H 9/02866; H03H 9/02874; H03H 9/02992; H03H 9/0576; H03H 9/145; H03H 9/14594; H03H 9/542; H03H 9/605; H03H 11/04; H03H 2001/005; H03H 2001/0092; H03H 2007/013; H03H 9/0095; H03H 9/132; H03H 9/584; H03H 9/587; H03H 9/60; H01F 17/0013; H01F 27/292; H01F 17/00; H01F 2017/0026; H01F 27/00; H01G 4/30; H01G 4/40; H01G 4/232; H01G 4/012; H01G 4/005; H01G 4/12; H01G 4/1227; H01G 2/065; H01G 4/0085; H01G 4/1218; H01G 4/1209; H01G 2/06; H01G 4/35; H01G 2/02; H01G 4/1236; H01G 4/224; H01G 4/248; H01G 4/228; H01G 4/2325; H01G 4/302; H01G 4/008; H01G 4/08; H01G 4/306; H01G 4/32; H01G 4/33; H01G 4/385; H01G 2/14; H01G 2/22; H01G 4/018; H01G 4/105; H01G 4/236; H01G 4/258; H01G 4/38; H01G 9/00; H01G 9/012; H01G 9/048; H01P 1/20
See application file for complete search history.

(56) References Cited

U.S. PATENT DOCUMENTS

2023/0035574 A1\* 2/2023 Motoyama ............... H01G 4/40
2023/0044859 A1\* 2/2023 Motoyama ........... H03H 7/0138

\* cited by examiner

FILTER APPARATUS

CROSS REFERENCE TO RELATED APPLICATIONS

This nonprovisional application is based on Japanese Patent Application No. 2023-023294 filed with the Japan Patent Office on Feb. 17, 2023, the entire contents of which are hereby incorporated herein by reference.

BACKGROUND OF THE INVENTION

1. Field of the Invention

The present disclosure relates to filter apparatuses, and more specifically to a technique to prevent lowering in pass characteristics in a filter apparatus.

2. Description of the Related Art

Japanese Patent Laid-Open No. 2008-167157 discloses a multilayer high-pass filter including two LC parallel resonators. The high-pass filter in Japanese Patent Laid-Open No. 2008-167157 is configured such that the two LC parallel resonators are coupled to each other by a capacitor.

The high-pass filter in Japanese Patent Laid-Open No. 2008-167157 has a structure in which the capacitor for coupling the two resonators to each other is arranged around an upper surface of a multilayer body. In the structure in Japanese Patent Laid-Open No. 2008-167157, the capacitor for coupling the resonators to each other is not grounded and hence an electrostatic potential of a capacitor electrode included in the capacitor is higher than a ground potential. Therefore, when a low-potential portion such as an external shield of an external apparatus comes closer to a portion around the upper surface of the high-pass filter, the capacitor electrode of the high-pass filter and a shield electrode of the external apparatus may be coupled to each other to form a shunt capacitance. A frequency at the reflection zero caused by the capacitor then lowers, which may consequently be a factor for lowering in pass characteristics of the high-pass filter.

SUMMARY OF THE INVENTION

Example embodiments of the present invention prevent lowering in pass characteristics caused by an external shield electrode in filter apparatuses.

A filter apparatus according to an example embodiment of the present invention includes a multilayer body in which a plurality of dielectric layers are layered, an input terminal, an output terminal, a ground terminal, a ground electrode connected to the ground terminal, a plate electrode, and first to fourth lines. The multilayer body includes a first surface and a second surface. The input terminal, the output terminal, and the ground terminal are provided on the second surface. The plate electrode is closer to the first surface than the ground electrode. The first line is electrically connected to the input terminal and the plate electrode. The second line is electrically connected to the output terminal and the plate electrode. The third line and the fourth line connect the plate electrode and the ground electrode to each other. The first line is capacitively coupled to the second line. When the multilayer body is viewed in a plan view from a layering direction, the plate electrode covers a portion of a space providing capacitive coupling between the first line and the second line.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
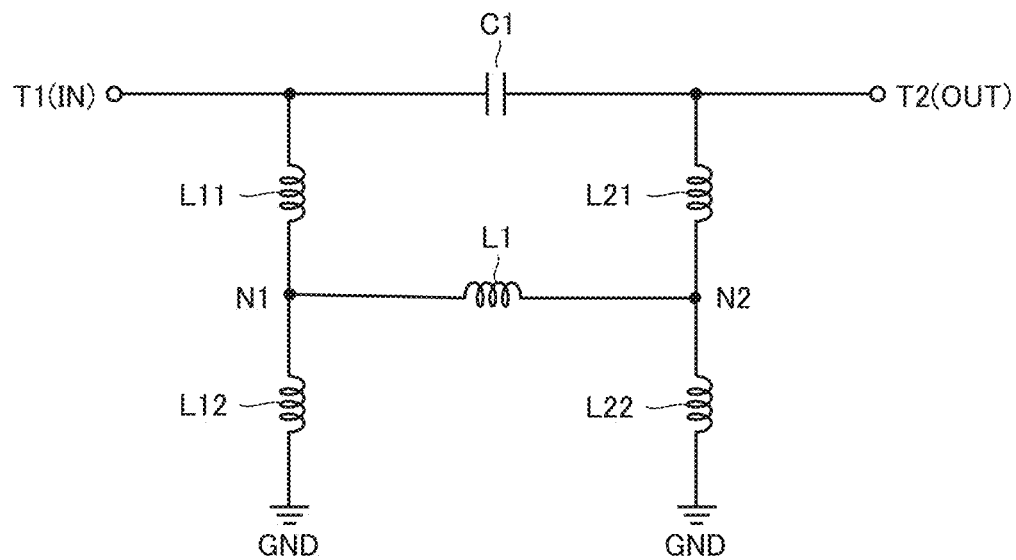
FIG. 1 is an equivalent circuit diagram of a filter apparatus according to a first example embodiment of the present invention.

Example embodiments of the present invention will be described in detail below with reference to the drawings. The same or corresponding elements in the drawings are denoted by the same reference characters and description thereof will not be repeated.

First Example Embodiment

FIG. 1 is an equivalent circuit diagram of a filter apparatus 100 according to a first example embodiment of the present invention. Filter apparatus 100 includes an input terminal T1, an output terminal T2, a ground terminal GND, a capacitor C1, and inductors L1, L11, L12, L21, and L22.

Capacitor C1 is connected between input terminal T1 and output terminal T2. Inductors L11 and L12 are connected in series between input terminal T1 and ground terminal GND. Inductors L21 and L22 are connected in series between output terminal T2 and ground terminal GND. Inductor L1 is connected between a connection node N1 and a connection node N2, connection node N1 being between inductor L11 and inductor L12, connection node N2 being between inductor L21 and inductor L22. In other words, filter apparatus 100 is configured such that two shunt inductors in a x-type high-pass filter are connected to each other.

Figure 2:
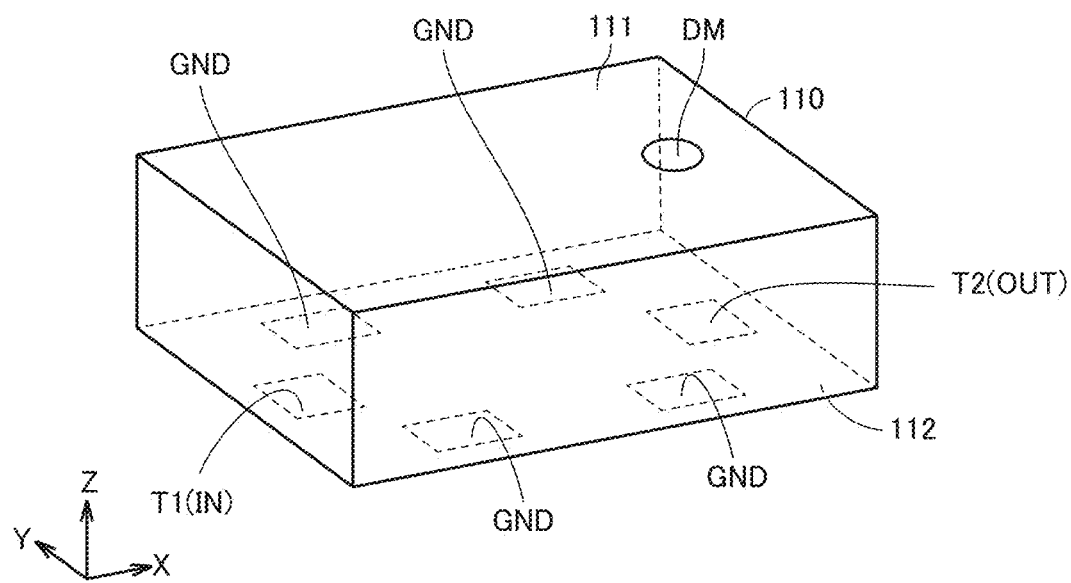
FIG. 2 is an external perspective view of the filter apparatus in the first example embodiment of the present invention.

A structure of filter apparatus 100 will now be described with reference to FIGS. 2 and 3. FIG. 2 is an external perspective view of filter apparatus 100 and FIG. 3 is a transparent perspective view showing an example internal structure of filter apparatus 100.

Figure 3:
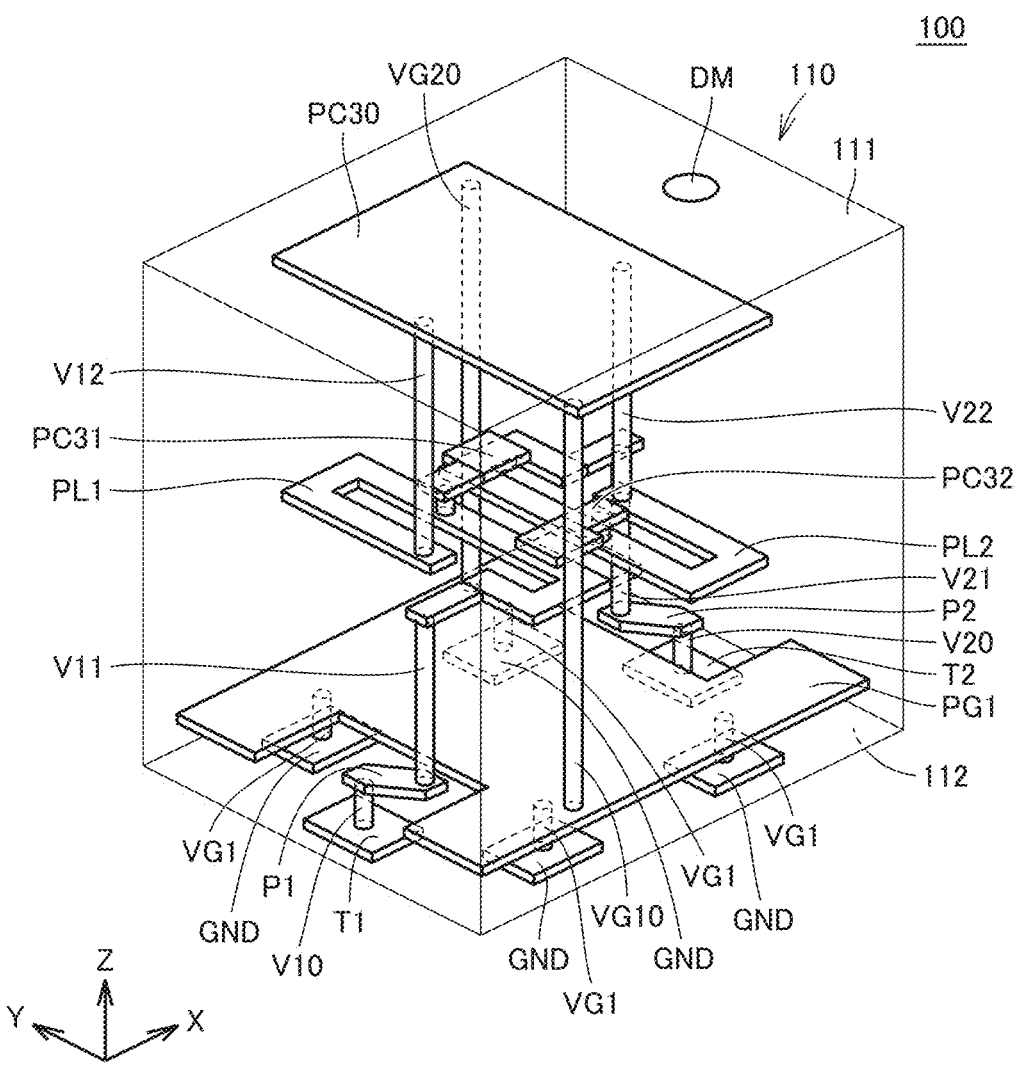
FIG. 3 is a transparent perspective view showing an internal structure of the filter apparatus in the first example embodiment of the present invention.
Figure 4:
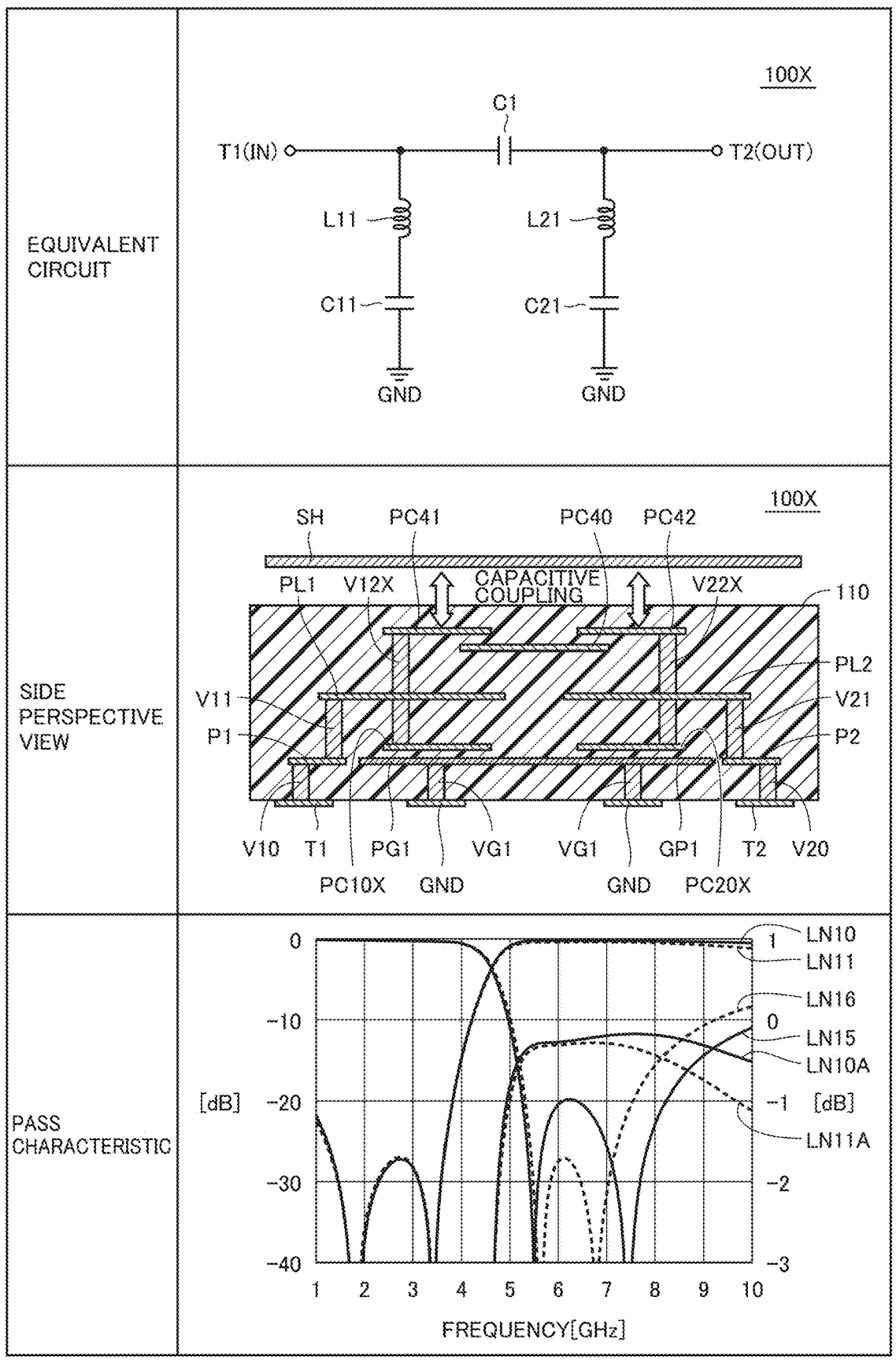
FIG. 4 is a diagram for illustrating a configuration of a filter apparatus in a comparative example and influence on pass characteristics by an external shield electrode.

Referring to FIGS. 3 and 4, filter apparatus 100 includes a multilayer body 110 in a shape of a cuboid or substantially a cuboid. Multilayer body 110 includes a plurality of dielectric layers layered in a layering direction. Each dielectric layer is preferably made of a resin or ceramic such as low temperature co-fired ceramics (LTCC), for example. In the inside of multilayer body 110, the inductors and the capacitors described with reference to FIG. 1 include a plurality of electrodes provided in the dielectric layers and a plurality of vias provided between the dielectric layers. The "via" herein refers to a columnar conductor provided in a dielectric layer to connect between electrodes provided in different dielectric layers. The via is formed from a conductive paste, plating, and/or a metallic pin, for example.

In the description below, a layering direction of the dielectric layers in multilayer body 110 is defined as a "Z-axis direction," a direction along a long side of multilayer body 110 which is perpendicular or substantially perpendicular to the Z-axis direction is defined as an "X-axis direction," and a direction along a short side of multilayer body 110 is defined as a "Y-axis direction." A positive direction along the Z axis in each figure may be referred to as an upper side and a negative direction may be referred to as a lower side below.

A directional mark DM to specify a direction of filter apparatus 100 is provided on an upper surface 111 of multilayer body 110. External terminals (input terminal T1, output terminal T2, and ground terminal GND) to connect between filter apparatus 100 and an external apparatus are provided on a lower surface 112 of multilayer body 110. Input terminal T1, output terminal T2, and ground terminal GND are each an electrode having a shape of a flat plate, and are, for example, land grid array (LGA) terminals regularly arranged on lower surface 112 of multilayer body 110.

Input terminal T1 is arranged at a position in lower surface 112 which is around a center in the Y-axis direction and proximate to an end in the negative direction of the X axis. Output terminal T2 is arranged at a position in lower surface 112 which is around the center in the Y-axis direction and proximate to an end in the positive direction of the X axis. Ground terminals GND are provided along two long sides of lower surface 112.

Input terminal T1 is connected to a plate electrode PL1 provided in a dielectric layer around the center in the layering direction through a via V10, a plate electrode P1, and a via V11 provided in the inside of multilayer body 110. Via V10 and via V11 are offset in a portion of plate electrode P1.

Plate electrode PL1 is preferably, for example, a band-shaped electrode in a C shape or substantially in a C shape when multilayer body 110 is viewed in a plan view from the layering direction (Z-axis direction) and includes a first end connected to via V11. Plate electrode PL1 includes a second end connected to a via V12. Via V12 extends from plate electrode PL1 in a direction toward upper surface 111 and is connected to a plate electrode PC30 arranged in a dielectric layer close to upper surface 111.

Output terminal T2 is connected to a plate electrode PL2 provided in the dielectric layer around the center in the layering direction through a via V20, a plate electrode P2, and a via V21 arranged in the inside of multilayer body 110. Via V20 and via V21 are offset in a portion of plate electrode P2.

Plate electrode PL2 is preferably, for example, a band-shaped electrode in a C shape or substantially in a C shape similarly to plate electrode PL1, and arranged at a distance in the positive direction of the X axis from plate electrode PL1 in the same dielectric layer where plate electrode PL1 is provided. Plate electrode PL2 has a first end connected to via V21 and includes a second end connected to a via V22.

Via V22 extends from plate electrode PL2 in a direction toward upper surface 111 and is connected to plate electrode PC30.

When multilayer body 110 is viewed in the plan view from the layering direction, plate electrode PC30 is an electrode substantially in a rectangular shape and covers plate electrodes PL1 and PL2. Plate electrode PC30 is connected to a ground electrode PG1 provided between lower surface 112 and plate electrodes PL1 and PL2, through vias VG10 and VG20.

Ground electrode PG1 is preferably, for example, in an H shape or substantially in an H shape when multilayer body 110 is viewed in the plan view from the layering direction. Ground electrode PG1 is connected to a plurality of ground terminals GND provided on lower surface 112 through vias VG1.

A capacitor electrode PC31 is connected through a via to a midpoint of a path from the first end to the second end of plate electrode PL1. Capacitor electrode PC31 is provided in a dielectric layer different from the dielectric layer where plate electrode PL1 is provided. Capacitor electrode PC31 extends in the positive direction of the X axis from a portion of connection to plate electrode PL1. When multilayer body 110 is viewed in the plan view from the layering direction, a portion of capacitor electrode PC31 overlaps with plate electrode PL2.

Similarly, a capacitor electrode PC32 is connected through a via to a midpoint of a path from the first end to the second end of plate electrode PL2. Capacitor electrode PC32 is provided in a dielectric layer different from the dielectric layer where plate electrode PL2 is provided. Capacitor electrode PC32 extends in the negative direction of the X axis from a portion of connection to plate electrode PL2. When multilayer body 110 is viewed in the plan view from the layering direction, a portion of capacitor electrode PC32 overlaps with plate electrode PL1.

In other words, the path through which input terminal T1 and plate electrode PL1 are connected to each other and the path through which output terminal T2 and plate electrode PL2 are connected to each other are capacitively coupled to each other. A portion of capacitive coupling of the two paths, that is, capacitor electrodes PC31 and PC32, is covered with plate electrode PC30 when multilayer body 110 is viewed in the plan view from the layering direction.

The path from via V10 through plate electrode P1, via V11, plate electrode PL1, and via V12 to plate electrode PC30 in FIG. 3 corresponds to inductor L11 in FIG. 1 and via VG10 corresponds to inductor L12 in FIG. 1. The path from via V20 through plate electrode P2, via V21, plate electrode PL2, and via V22 to plate electrode PC30 in FIG. 3 corresponds to inductor L21 in FIG. 1. Via VG20 corresponds to inductor L22 in FIG. 1. Plate electrode PC30 in FIG. 3 corresponds to inductor L1 in FIG. 1.

Capacitor C1 in FIG. 1 includes plate electrode PL1 and capacitor electrode PC32 and plate electrode PL2 and capacitor electrode PC31 in FIG. 3. It is not necessary to provide both of capacitor electrodes PC31 and PC32. If desired capacitive coupling between the two paths can be ensured, any one of capacitor electrodes PC31 and PC32 may be provided.

Influence by External Shield Electrode

In the π-type high-pass filter as in the equivalent circuit diagram in FIG. 1, opposing electrodes of capacitor C1 connected between input terminal T1 and output terminal T2 are not directly connected to ground terminal GND. Therefore, the electrode included in capacitor C1 is relatively higher in electrostatic potential than ground terminal GND.

In this case, when a low-potential portion such as an external shield electrode of an external apparatus or a ground electrode comes closer to filter apparatus 100, a shunt capacitance may be provided between the electrode included in capacitor C1 and the low-potential portion and they may be capacitively coupled to each other. A frequency at the reflection zero caused by capacitor C1 then lowers, which may be a factor for lowering in pass characteristics of the filter apparatus.

FIG. 4 is a diagram showing a result of simulation conducted for a filter apparatus 100X in a comparative example for verifying the problem as described above. Specifically, FIG. 4 shows a configuration of filter apparatus 100X in the comparative example, and variation in pass characteristics depending on presence or absence of an external shield electrode.

FIG. 4 shows in an upper tier, an equivalent circuit diagram of filter apparatus 100X. Filter apparatus 100X is provided with capacitors C11 and C21 instead of inductors L1, L12, and L22 in filter apparatus 100 in FIG. 1. Capacitor C11 is connected between inductor L11 and ground terminal GND. Capacitor C21 is connected between inductor L21 and ground terminal GND. In other words, filter apparatus 100X is a π-type high-pass filter composed of two shunt-connected LC series resonators (L11+C11 and L21+C21) and capacitor C1.

FIG. 4 shows in a middle tier, a transparent side view of filter apparatus 100X. In filter apparatus 100X, a capacitor electrode PC10X is arranged at a lower end of a via V12X connected to pass through a second end of plate electrode PL1 and capacitor C11 is defined by capacitor electrode PC10X and ground electrode PG1. A capacitor electrode PC20X is arranged at a lower end of a via V22X connected to pass through a second end of plate electrode PL2, and capacitor C21 is defined by capacitor electrode PC20X and ground electrode PG1.

Capacitor electrodes PC41 and PC42 are connected to respective upper ends of vias V12X and V22X. A capacitor electrode PC40 is arranged to partially be opposed to both of capacitor electrodes PC41 and PC42. Capacitor C1 is defined by capacitor electrodes PC40, PC41, and PC42.

In filter apparatus 100X configured as described above, when a low-potential portion (an external shield electrode SH) in an external apparatus comes closer to upper surface 111 of multilayer body 110, capacitor electrodes PC40, PC41, and PC42 included in capacitor C1 may capacitively be coupled to external shield electrode SH.

FIG. 4 shows in a lower tier, a graph of variation in pass characteristics of filter apparatus 100X depending on presence or absence of external shield electrode SH. In the graph, the abscissa represents a frequency and the ordinate represents an insertion loss (solid lines LN10 and LN10A and dashed lines LN11 and LN11A) and a return loss (a solid line LN15 and a dashed line LN16). Solid lines LN10, LN10A, and LN15 in the graph represent characteristics in the absence of external shield electrode SH and dashed lines LN11, LN11A, and LN16 represent characteristics when external shield electrode SH comes closer. The insertion loss shown with solid line LN10A and dashed line LN11A is an enlarged version of the insertion loss shown with solid line LN10 and dashed line LN11, and the ordinate on the right of the graph corresponds thereto.

As shown in the graph in FIG. 4, it can be seen that, when external shield electrode SH comes closer, a frequency at an attenuation pole lowers (dashed line LN16), which results in lowering in insertion loss on a high frequency side of a pass band (dashed lines LN11 and LN11A).

Figure 5:
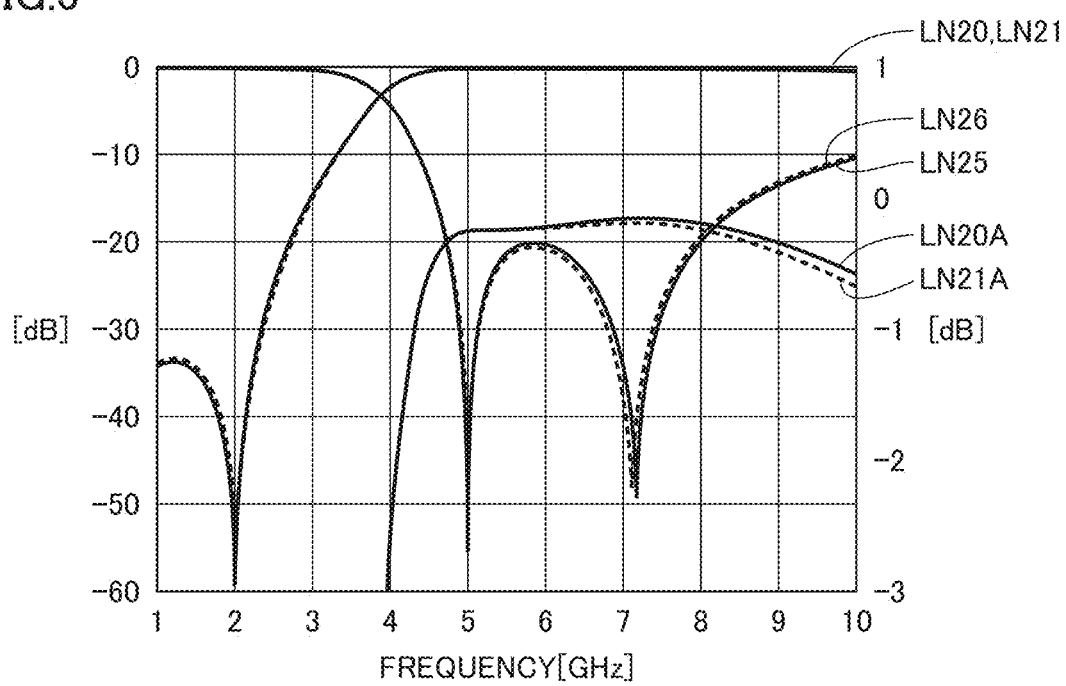
FIG. 5 is a diagram for illustrating influence on pass characteristics depending on presence or absence of the external shield electrode in the filter apparatus according to the first example embodiment of the present invention.

FIG. 5 is a diagram showing variations in pass characteristics depending on presence or absence of the external shield electrode on a side of upper surface 111 of multilayer body 100 in filter apparatus 100 according to the first example embodiment. In FIG. 5, the abscissa represents a frequency and the ordinate represents an insertion loss (solid lines LN20 and LN20A and dashed lines LN21 and LN21A) and a return loss (a solid line LN25 and a dashed line LN26). Solid lines LN20, LN20A, and LN25 represent characteristics in the absence of the external shield electrode, whereas dashed lines LN21, LN21A, and LN26 represent characteristics when the external shield electrode comes closer.

As shown in FIG. 5, it can be seen that, in filter apparatus 100 in the first example embodiment, variations in insertion loss and return loss when the external shield electrode comes closer to upper surface 111 is less than variations in filter apparatus 100X in the comparative example, and influence by the external shield electrode is reduced.

This is because plate electrodes PL1 and PL2 and capacitor electrodes PC31 and PC32 included in capacitor C1 are covered with plate electrode PC30 having lower electrostatic potential than these electrodes and thus plate electrode PC30 defines and functions as an internal shield to reduce or prevent coupling between each electrode included in capacitor C1 and the external shield electrode.

Thus, the configuration to cover the portion of capacitive coupling between two shunt paths included in the high-pass filter with the plate electrode connected to the ground electrode can prevent lowering in pass characteristics caused by the external shield electrode.

In the first example embodiment, the path through via V10, plate electrode P1, via V11, plate electrode PL1, and via V12 corresponds to the "first path" in the present disclosure. In the first example embodiment, the path through via V20, plate electrode P2, via V21, plate electrode PL2, and via V22 corresponds to the "second path" in the present disclosure. "Via VG10" and "via VG20" in the first example embodiment correspond to the "third path" and the "fourth path" in the present disclosure, respectively. "Upper surface 111" and "lower surface 112" in the first example embodiment correspond to the "first surface" and the "second surface" in the present disclosure, respectively. "Capacitor electrode PC31" and "capacitor electrode PC32" in the first example embodiment correspond to the "first capacitor electrode" and the "second capacitor electrode" in the present disclosure, respectively. "Plate electrode PC30" in the first example embodiment corresponds to the "plate electrode" in the present disclosure.

In the "first line" above, "plate electrode PL1" corresponds to the "first interconnection pattern" in the present disclosure, "vias V10 and V11" correspond to the "first via" in the present disclosure, and "via V12" corresponds to the "second via" in the present disclosure. In the "second line" above, "plate electrode PL2" corresponds to the "second interconnection pattern" in the present disclosure, "vias V20 and V21" correspond to the "third via" in the present disclosure, and "via V22" corresponds to the "fourth via" in the present disclosure.

First Modification

A configuration in which the LC series resonator is applied to the shunt path in filter apparatus 100 in the first example embodiment will be described in a first modification. In other words, an example in which the feature in the first example embodiment is applied to filter apparatus 100X in the comparative example in FIG. 4 will be described.

Figure 6:
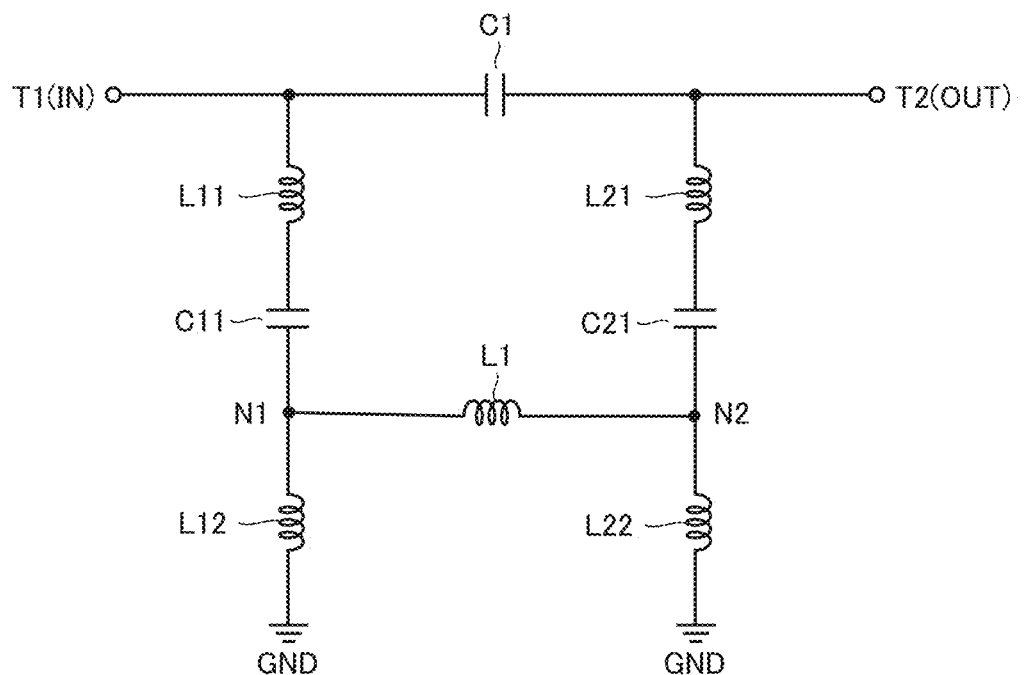
FIG. 6 is an equivalent circuit diagram of a filter apparatus according to a first modification of an example embodiment of the present invention.

FIG. 6 is an equivalent circuit diagram of a filter apparatus 100A according to the first modification. In filter apparatus 100A, capacitor C11 is added between inductor L11 and connection node N1 in FIG. 1, and furthermore, capacitor C21 is added between inductor L21 and connection node N2. The configuration is otherwise the same or substantially the same as in filter apparatus 100, and description of elements the same as or corresponding to those in FIG. 1 will not be repeated.

Figure 7:
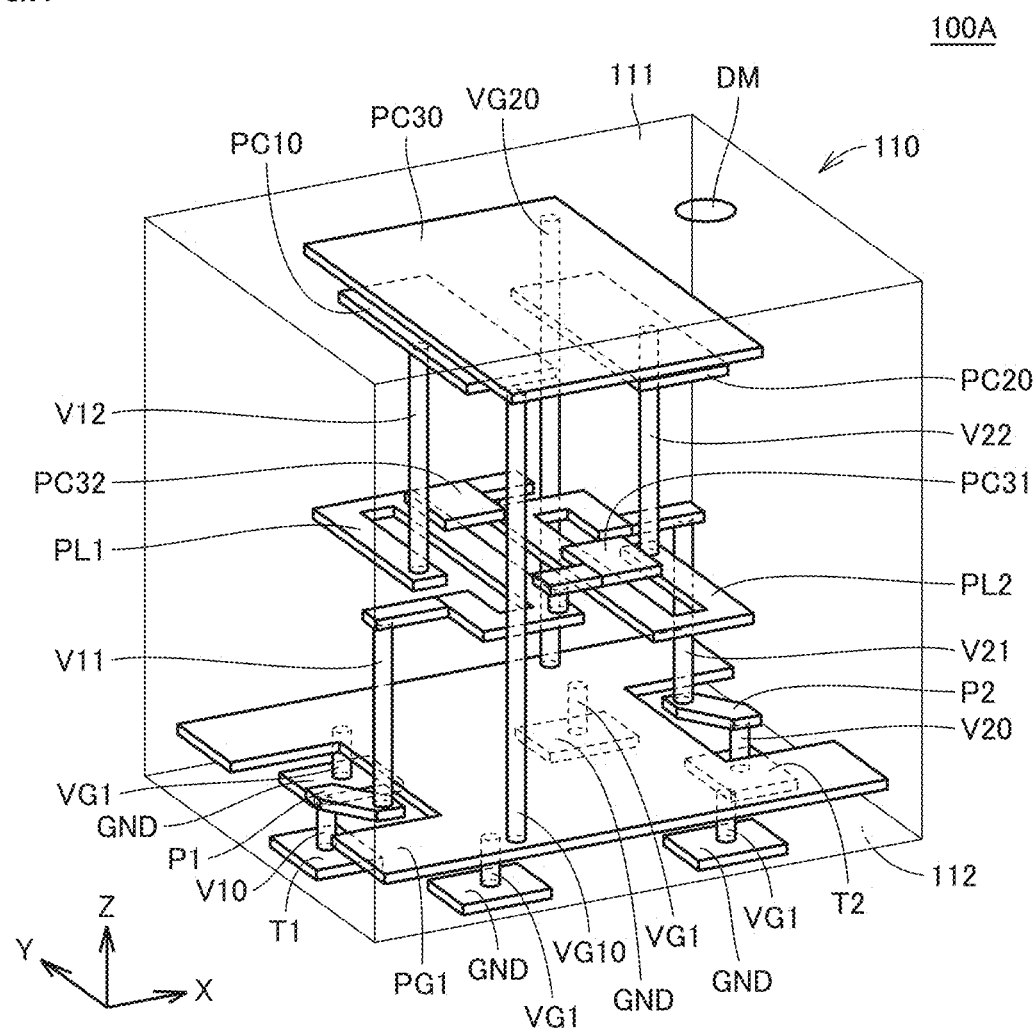
FIG. 7 is a transparent perspective view showing an internal structure of the filter apparatus according to the first modification.

FIG. 7 is a transparent perspective view showing an internal structure of filter apparatus 100A in the first modification. In FIG. 7, filter apparatus 100A is configured to include capacitor electrodes PC10 and PC20 as being added to filter apparatus 100 described with reference to FIG. 3.

Capacitor electrode PC10 is connected to an end on the side of upper surface 111, of via V12 connected to the second end of plate electrode PL1. Capacitor electrode PC10 is in or substantially in a rectangular shape when multilayer body 110 is viewed in the plan view from the layering direction, and arranged as being opposed to plate electrode PC30. Capacitor C11 in FIG. 6 includes capacitor electrode PC10 and plate electrode PC30.

Capacitor electrode PC20 is connected to an end on the side of upper surface 111, of via V22 connected to the second end of plate electrode PL2. Capacitor electrode PC20 is in or substantially in a rectangular shape when multilayer body 110 is viewed in the plan view from the layering direction, and opposed to plate electrode PC30. Capacitor C21 in FIG. 6 includes capacitor electrode PC20 and plate electrode PC30.

When multilayer body 110 is viewed in the plan view from the layering direction, plate electrode PC30 covers capacitor electrodes PC10 and PC20.

Since the attenuation pole can be added to a non-pass band by providing the LC series resonator in the shunt path, attenuation characteristics of the filter apparatus can be improved. Furthermore, capacitor electrodes PC10 and PC20 which are electrodes on a high electrostatic potential side in the capacitor included in the LC series resonator are covered with plate electrode PC30 which may function as the internal shield electrode. Therefore, even when the external shield electrode comes closer to upper surface 111 of multilayer body 110, fluctuation in electrostatic potential of capacitor electrodes PC10 and PC20 is prevented. Lowering in pass characteristics caused by the external shield electrode can thus be reduced or prevented.

Figure 8:
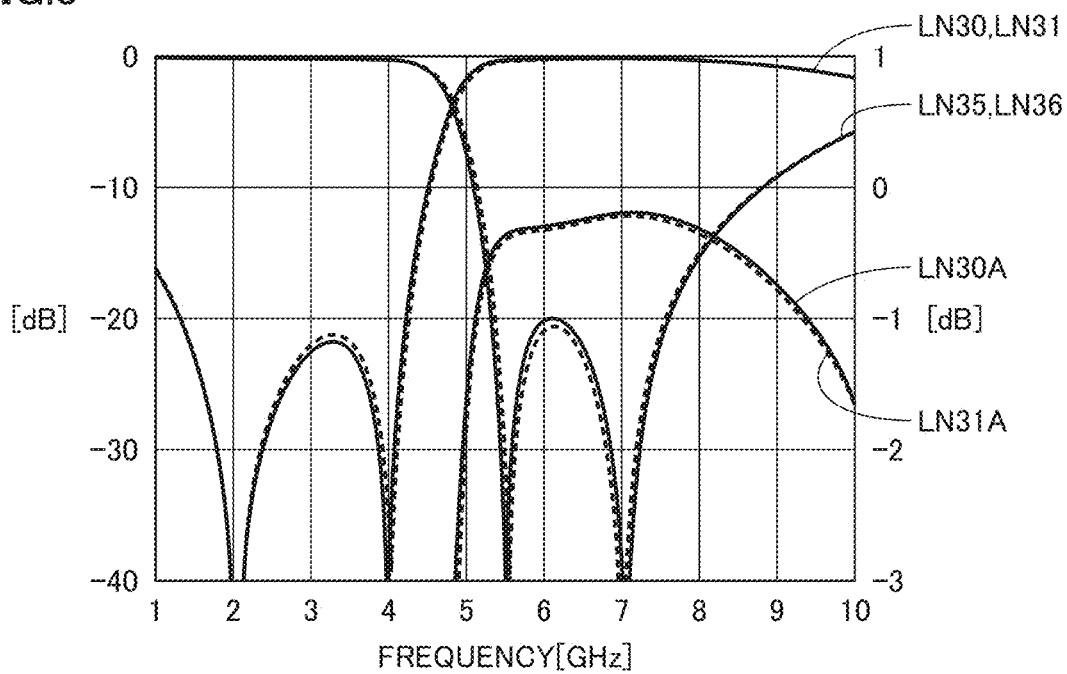
FIG. 8 is a diagram for illustrating influence on pass characteristics depending on presence or absence of the external shield electrode in the filter apparatus according to the first modification.

FIG. 8 is a diagram for illustrating influence on pass characteristics depending on presence or absence of the external shield electrode in filter apparatus 100A in the first modification. In FIG. 8, the abscissa represents a frequency and the ordinate represents an insertion loss (solid lines LN30 and LN30A and dashed lines LN31 and LN31A) and a return loss (a solid line LN35 and a dashed line LN36). Solid lines LN30, LN30A, and LN35 represent characteristics in the absence of the external shield electrode, whereas dashed lines LN31, and LN31A, LN36 represent characteristics when the external shield electrode comes closer.

As shown in FIG. 8, it can be seen that, in filter apparatus 100A in the first modification, the insertion loss and the return loss when the external shield electrode comes closer to upper surface 111 are the same or substantially the same as those in the absence of the external shield electrode. Therefore, the configuration of filter apparatus 100A also can prevent lowering in pass characteristics caused by the external shield electrode.

"Capacitor electrode PC10" and "capacitor electrode PC20" in the first modification correspond to the "fourth capacitor electrode" and the "fifth capacitor electrode" in the present disclosure, respectively.

Second Modification

Figure 9:
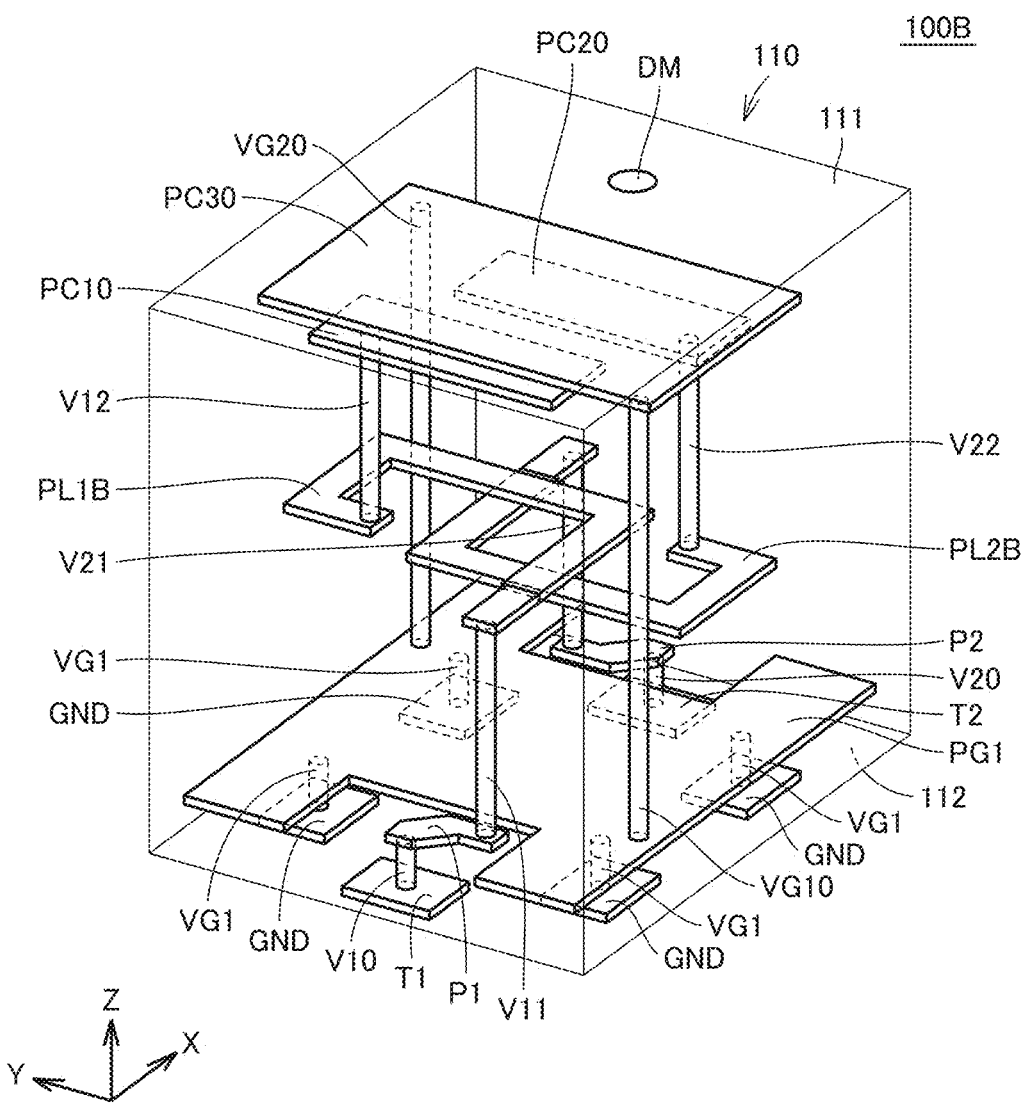
FIG. 9 is a transparent perspective view showing an internal structure of a filter apparatus according to a second modification of an example embodiment of the present invention.

In a second modification, another example configuration of capacitive coupling between two shunt paths in a filter apparatus similar in circuitry to the first modification shown in FIG. 6 will be described. FIG. 9 is a transparent perspective view showing an internal structure of a filter apparatus 100B in the second modification. Filter apparatus 100B is configured such that plate electrodes PL1 and PL2 in filter apparatus 100A in the first modification shown in FIG. 7 are replaced with plate electrodes PL1B and PL2B and capacitor electrodes PC31 and PC32 are removed. The configuration of filter apparatus 100B is otherwise the same or substantially the same as in filter apparatus 100A, and description of elements the same or substantially the same as those in FIG. 7 will not be repeated.

Referring to FIG. 9, when multilayer body 110 is viewed in the plan view from the layering direction, each of plate electrodes PL1B and PL2B is a band-shaped electrode in or substantially in a C shape. Plate electrode PL1B includes a first end connected to via V11 and a second end connected to via V12. Plate electrode PL2B includes a first end connected to via V21 and a second end connected to via V22.

Plate electrode PL1B and plate electrode PL2B are provided in dielectric layers different from each other. When multilayer body 110 is viewed in the plan view from the layering direction, a portion of plate electrode PL1B overlaps with a portion of plate electrode PL2B. In other words, plate electrode PL1B and plate electrode PL2B are capacitively coupled to each other by electrodes included in themselves to implement capacitor C1 in FIG. 6. Furthermore, when multilayer body 110 is viewed in the plan view from the layering direction, plate electrode PL1B and plate electrode PL2B and capacitor electrodes PC10 and PC20 are covered with plate electrode PC30 provided on the side of upper surface 111.

In the configuration of filter apparatus 100B in the second modification as well, plate electrodes PL1B and PL2B and capacitor electrodes PC10 and PC20 on the high electrostatic potential side included in the capacitor are covered with plate electrode PC30 that can define and function as the internal shield electrode. Therefore, even when the external shield electrode comes closer to upper surface 111 of multilayer body 110, fluctuation of the electrostatic potential of these electrodes is prevented. Lowering in pass characteristics caused by the external shield electrode can thus be prevented.

In the second modification, the path through via V10, plate electrode P1, via V11, plate electrode PL1B, and via V12 corresponds to the "first path" in the present disclosure. In the second modification, the path through via V20, plate electrode P2, via V21, plate electrode PL2B, and via V22 corresponds to the "second path" in the present disclosure.

Third Modification

In a third modification, another example configuration to provide capacitive coupling between plate electrodes PL1 and PL2 in filter apparatus 100A in the first example embodiment will be described.

Figure 10:
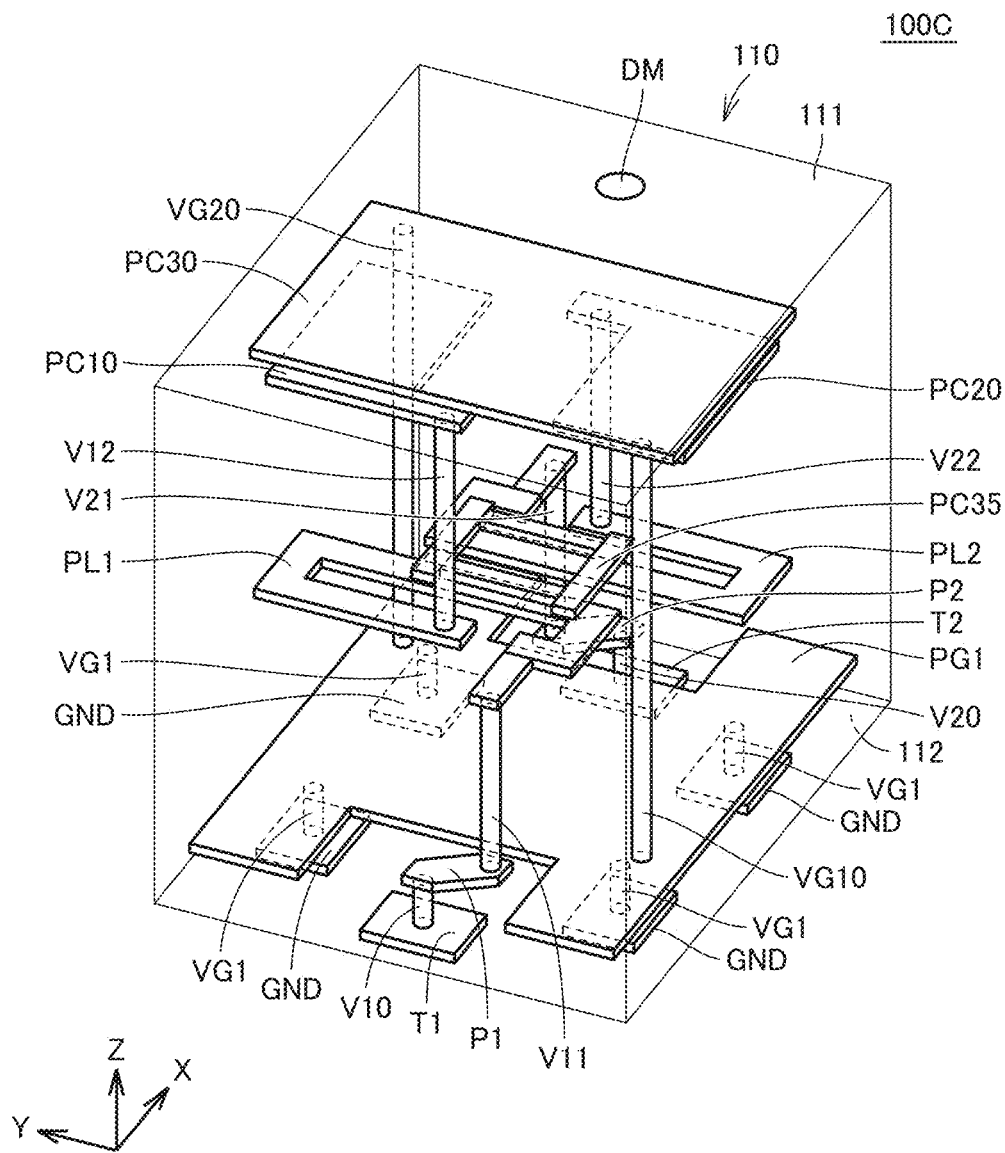
FIG. 10 is a transparent perspective view showing an internal structure of a filter apparatus according to a third modification of an example embodiment of the present invention.

FIG. 10 is a transparent perspective view showing an internal structure of a filter apparatus 100C in the third modification. Filter apparatus 100C is configured such that capacitor electrodes PC31 and PC32 in filter apparatus 100A are replaced with a capacitor electrode PC35. Filter apparatus 100C is otherwise the same or substantially similar in configuration to filter apparatus 100A, although a shape of at least one electrode is different, and description of the same or corresponding elements will not be repeated.

Referring to FIG. 10, capacitor electrode PC35 is configured such that four linear electrodes define a quadrangle with an opening there among. Capacitor electrode PC35 is provided in a dielectric layer between a dielectric layer where plate electrodes PL1 and PL2 are provided and a dielectric layer where plate electrode PC30 is provided. When multilayer body 110 is viewed in the plan view from the layering direction, capacitor electrode PC35 partially overlaps with plate electrodes PL1 and PL2. Capacitor C1 in FIG. 6 includes capacitor electrode PC35 and plate electrodes PL1 and PL2.

Furthermore, when multilayer body 110 is viewed in the plan view from the layering direction, capacitor electrode PC35, plate electrodes PL1 and PL2, and capacitor electrodes PC10 and PC20 are covered with plate electrode PC30 provided on the side of upper surface 111. Thus, even when the external shield electrode comes closer to upper surface 111 of multilayer body 110, fluctuation of the electrostatic potential of these electrodes is prevented. Therefore, lowering in pass characteristics caused by the external shield electrode can be prevented.

"Capacitor electrode PC35" in the third modification corresponds to the "third capacitor electrode" in the present disclosure.

Fourth Modification

In a fourth modification as well, another example configuration to provide capacitive coupling between plate electrodes PL1 and PL2 in filter apparatus 100A in the first example embodiment will be described.

Figure 11:
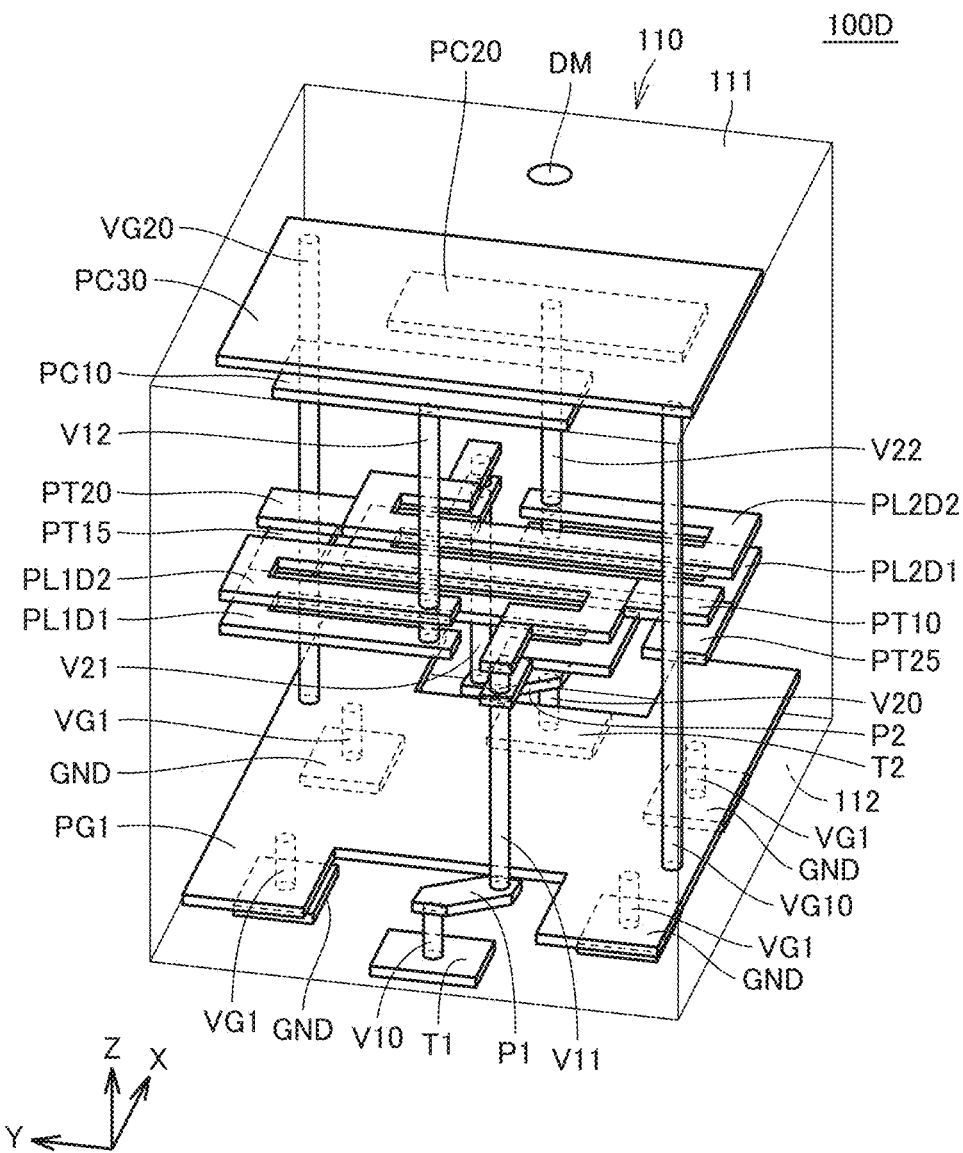
FIG. 11 is a transparent perspective view showing an internal structure of a filter apparatus according to a fourth modification of an example embodiment of the present invention.

FIG. 11 is a transparent perspective view showing an internal structure of a filter apparatus 100D in the fourth modification. In filter apparatus 100D, plate electrode PL1 in filter apparatus 100A is replaced with plate electrodes PL1D1 and PL1D2 and plate electrode PL2 is replaced with plate electrodes PL2D1 and PL2D2. Furthermore, capacitor electrodes PT10, PT15, PT20, and PT25 are provided instead of capacitor electrodes PC31 and PC32 of filter apparatus 100A. The configuration of filter apparatus 100D is otherwise the same or substantially the same as in filter apparatus 100A, and description of the same or corresponding elements will not be repeated. Plate electrodes PL1D1 and PL1D2 may comprehensively be referred to as a "plate electrode PL1D" and plate electrodes PL2D1 and PL2D2 may comprehensively be referred to as a "plate electrode PL2D."

Referring to FIG. 11, when multilayer body 110 is viewed in the plan view from the layering direction, plate electrodes PL1D1 and PL1D2 have the same or substantially the same shape as each other, and are superimposed on each other in different dielectric layers in layering direction. In FIG. 11, plate electrode PL1D2 is closer to upper surface 111 than plate electrode PL1D1. Plate electrodes PL1D1 and PL1D2 include first ends connected to via V11 and second ends connected to via V12. Capacitor electrode PT15 that extends in the positive direction of the X axis in the same dielectric layer is connected to plate electrode PL1D1. Capacitor electrode PT10 that extends in the negative direction of the Y axis in the same dielectric layer is connected to plate electrode PL1D2. When multilayer body 110 is viewed in the plan view from the layering direction, a position of connection of capacitor electrode PT15 in plate electrode PL1D1 is different from a position of connection of capacitor electrode PT10 in plate electrode PL1D2.

Similarly, when multilayer body 110 is viewed in the plan view from the layering direction, plate electrodes PL2D1 and PL2D2 have the same or substantially the same shape as each other, and are superimposed on each other in different dielectric layers in layering direction. In FIG. 11, plate electrode PL2D1 is provided in the same dielectric layer where plate electrode PL1D1 is provided, and plate electrode PL2D2 is provided in the same dielectric layer where plate electrode PL1D2 is provided. Plate electrodes PL2D1 and PL2D2 include first ends connected to via V21 and second ends connected to via V22. Capacitor electrode PT25 that extends in the negative direction of the X axis in the same dielectric layer is connected to plate electrode PL2D1. Capacitor electrode PT20 that extends in the positive direction of the Y axis in the same dielectric layer is connected to plate electrode PL2D2. When multilayer body 110 is viewed in the plan view from the layering direction, capacitor electrode PT25 is connected to plate electrode PL2D1 as partially overlapping with plate electrode PT10. When multilayer body 110 is viewed in the plan view from the layering direction, capacitor electrode PT20 is connected to plate electrode PL2D1 as partially overlapping with plate electrode PT15.

In other words, capacitor C1 in FIG. 6 includes a pair of capacitor electrode PT10 and capacitor electrode PT25 and a pair of capacitor electrode PT15 and capacitor electrode PT20. Only one of the pair of capacitor electrode PT10 and capacitor electrode PT25 and the pair of capacitor electrode PT10 and capacitor electrode PT25 may be provided.

When multilayer body 110 is viewed in the plan view from the layering direction, capacitor electrodes PT10, PT15, PT20, and PT25, plate electrodes PL1D and PL2D, and capacitor electrodes PC10 and PC20 are covered with plate electrode PC30. Thus, even when the external shield electrode comes closer to upper surface 111 of multilayer body 110, fluctuation of the electrostatic potential of these electrodes is prevented. Therefore, lowering in pass characteristics caused by the external shield electrode can be prevented.

"Capacitor electrodes PT10 and PT15" in the fourth modification correspond to the "first capacitor electrode" in the present disclosure. "Capacitor electrodes PT20 and PT25" in the fourth modification correspond to the "second capacitor electrode" in the present disclosure. In the fourth modification, the path through via V10, plate electrode P1, via V11, plate electrode PL1D, and via V12 corresponds to the "first path" in the present disclosure. In the fourth modification, the path through via V20, plate electrode P2, via V21, plate electrode PL2D, and via V22 corresponds to the "second path" in the present disclosure.

Fifth Modification

In a fifth modification as well, another example configuration to provide capacitive coupling between plate electrodes PL1 and PL2 in filter apparatus 100A in the first example embodiment will be described.

Figure 12:
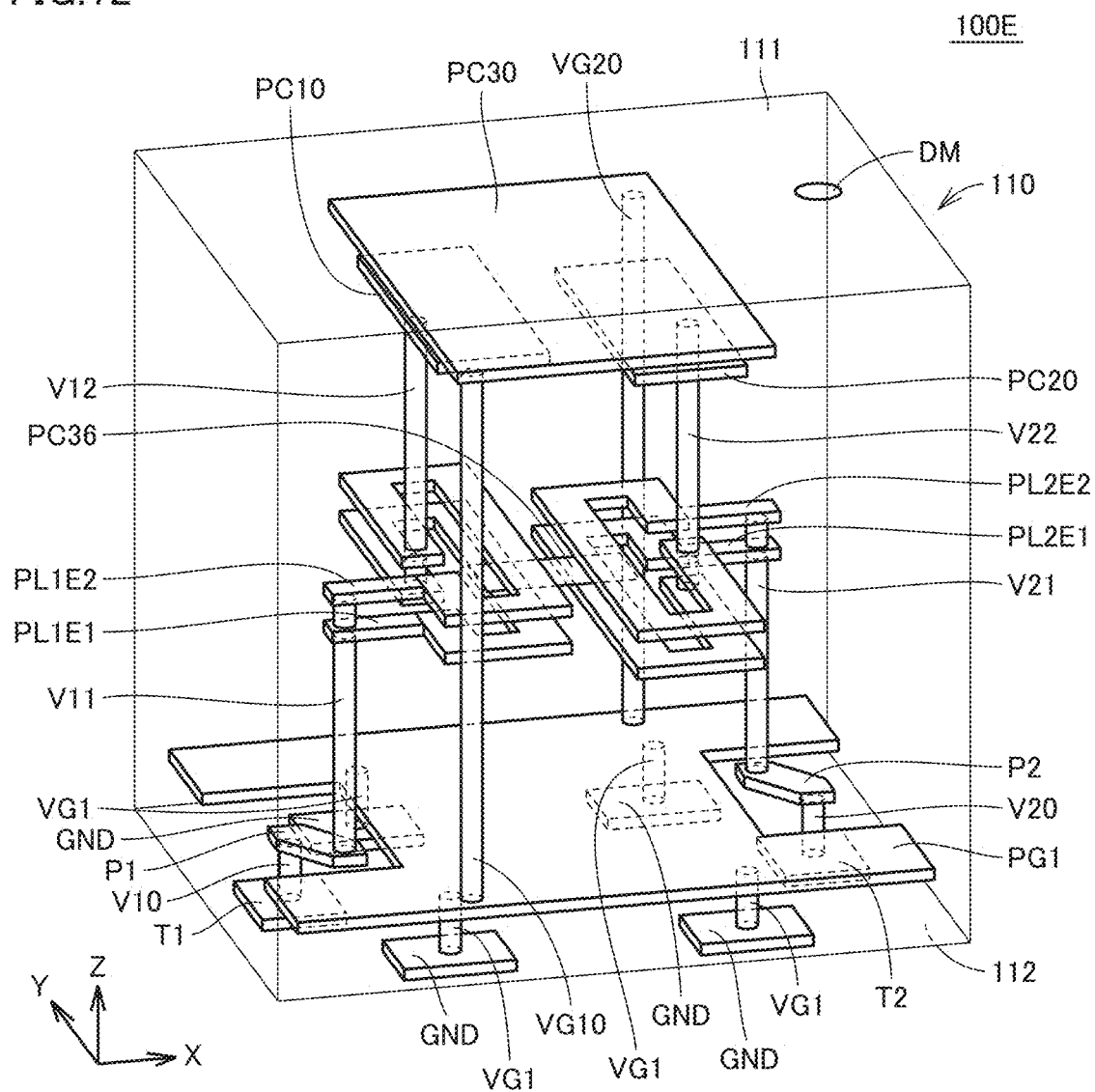
FIG. 12 is a transparent perspective view showing an internal structure of a filter apparatus according to a fifth modification of an example embodiment of the present invention.

FIG. 12 is a transparent perspective view showing an internal structure of a filter apparatus 100E in the fifth modification. In filter apparatus 100E, plate electrode PL1 in filter apparatus 100A is replaced with plate electrodes PL1E1 and PL1E2, and plate electrode PL2 is replaced with plate electrodes PL2E1 and PL2E2. Furthermore, a capacitor electrode PC36 is provided instead of capacitor electrodes PC31 and PC32 of filter apparatus 100A. The configuration of filter apparatus 100E is otherwise the same as in filter apparatus 100A, and description of the same elements will not be repeated. Plate electrodes PL1E1 and PL1E2 may comprehensively be referred to as a "plate electrode PL1E" and plate electrodes PL2E1 and PL2E2 may comprehensively be referred to as a "plate electrode PL2E."

Referring to FIG. 12, when multilayer body 110 is viewed in the plan view from the layering direction, plate electrodes PL1E1 and PL1E2 have the same or substantially the same shape as each other and are superimposed on each other in different dielectric layers in layering direction. In FIG. 12, plate electrode PL1E2 is arranged closer to upper surface 111 than plate electrode PL1E1. Plate electrodes PL1E1 and PL1E2 have first ends connected to via V11 and have second ends connected to via V12.

Similarly, when multilayer body 110 is viewed in the plan view from the layering direction, plate electrodes PL2E1 and PL2E2 have the same or substantially the same shape as each other and are superimposed on each other in different dielectric layers in layering direction. In FIG. 12, plate electrode PL2E1 is provided in the same dielectric layer where plate electrode PL1E1 is provided and plate electrode PL2E2 is provided in the same dielectric layer where plate electrode PL1E2 is provided. Plate electrodes PL2E1 and PL2E2 include first ends connected to via V21 and second ends connected to via V22.

Capacitor electrode PC36 is provided in a dielectric layer between the dielectric layer where plate electrodes PL1E1 and PL2E1 are provided and the dielectric layer where plate electrodes PL1E2 and PL2E2 are provided. In FIG. 12, capacitor electrode PC36 is a band-shaped electrode that extends in the X-axis direction. When multilayer body 110 is viewed in the plan view from the layering direction, capacitor electrode PC36 partially overlaps with plate electrodes PL1E and PL2E. In other words, capacitor C1 in FIG. 6 includes capacitor electrode PC36 and plate electrodes PL1E and PL2E.

When multilayer body 110 is viewed in the plan view from the layering direction, capacitor electrode PC36, plate electrodes PL1E and PL2E, and capacitor electrodes PC10 and PC20 are covered with plate electrode PC30. Thus, even when the external shield electrode comes closer to upper surface 111 of multilayer body 110, fluctuation of the electrostatic potential of these electrodes is prevented. Therefore, lowering in pass characteristics caused by the external shield electrode can be prevented.

"Capacitor electrode PC36" in the fifth modification corresponds to the "third capacitor electrode" in the present disclosure. In the fifth modification, the path through via V10, plate electrode P1, via V11, plate electrode PL1E, and via V12 corresponds to the "first path" in the present disclosure. In the fifth modification, the path through via V20, plate electrode P2, via V21, plate electrode PL2E, and via V22 corresponds to the "second path" in the present disclosure.

Second Example Embodiment

In a second example embodiment of the present invention and the following sixth to ninth modifications, a configuration including an LC series resonator additionally to the configuration of the filter apparatus in the first example embodiment or the first to fifth modifications will be described. Since the number of attenuation poles can be increased by addition of the resonator as described above, such a configuration can improve attenuation characteristics in the non-pass band of the filter apparatus.

Figure 13:
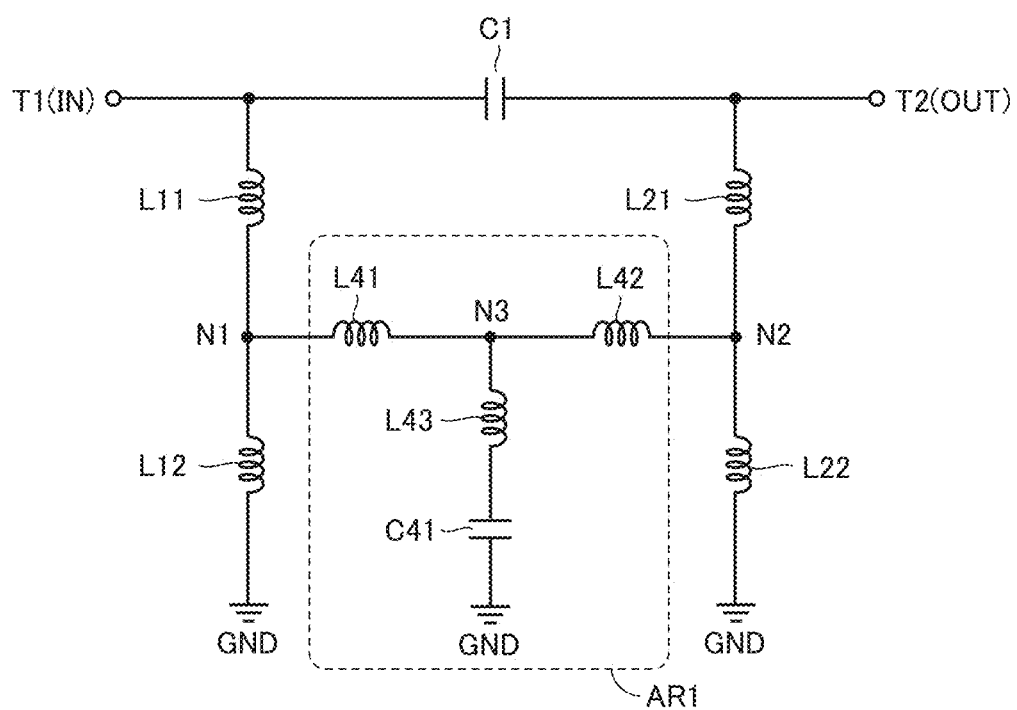
FIG. 13 is an equivalent circuit diagram of a filter apparatus according to a second example embodiment of the present invention.

FIG. 13 is an equivalent circuit diagram of a filter apparatus 100F according to the second example embodiment. Filter apparatus 100F is configured such that a portion of inductor L1 in filter apparatus 100 in the first example embodiment shown in FIG. 1 is replaced with a circuit shown with a dashed line as an area AR1 in FIG. 13.

Specifically, in filter apparatus 100F, inductors L41 and L42 connected in series are connected between connection node N1 and connection node N2, connection node N1 being between inductors L11 and L12, connection node N2 being between inductors L21 and L22. An inductor L43 includes one end connected to a connection node N3 between inductor L41 and inductor L42. Inductor L43 includes the other end connected to ground terminal GND with a capacitor C41 being interposed.

Inductors L41 and L42 substantially correspond to inductor L1 in FIG. 1. Therefore, filter apparatus 100F corresponds to such a configuration that an LC series resonance circuit (L43+C41) is connected between inductor L1 and ground terminal GND of filter apparatus 100 in the first example embodiment.

Figure 14:
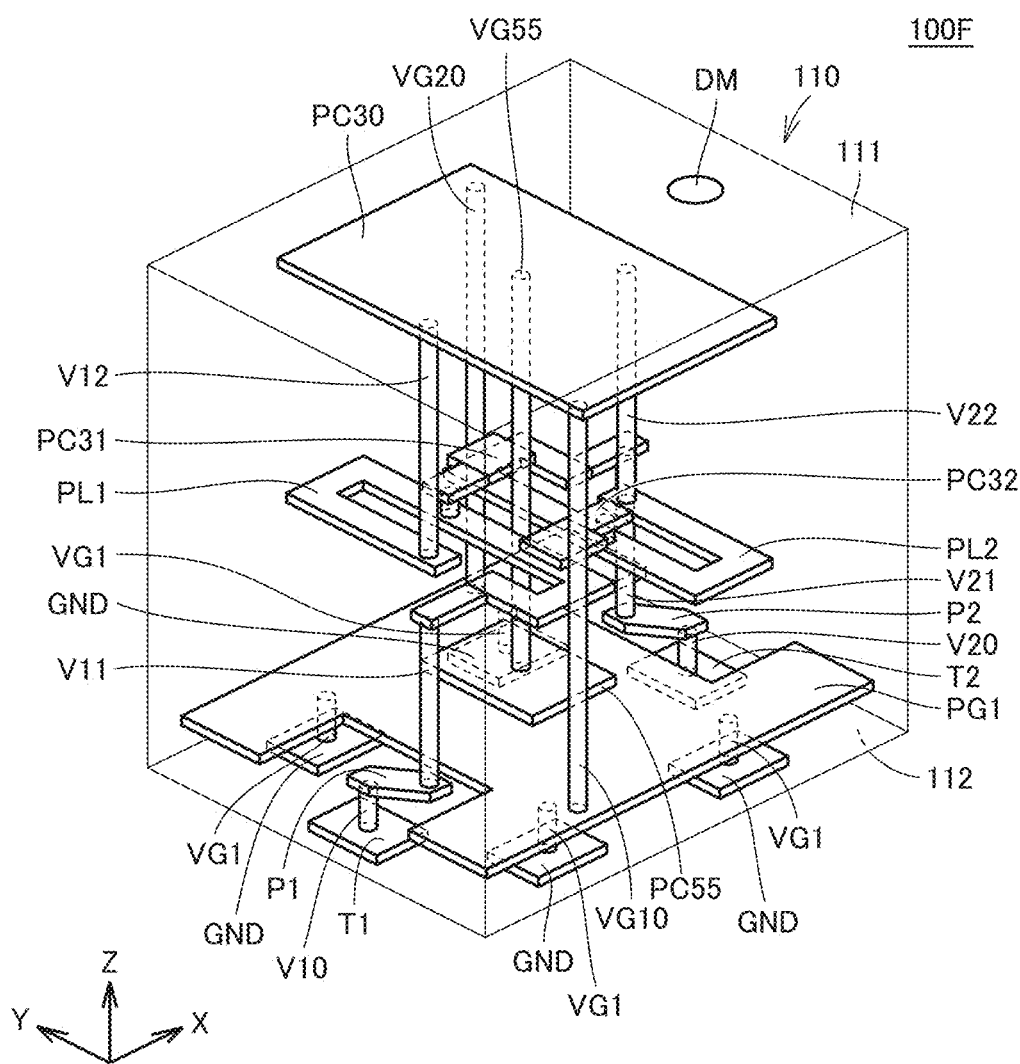
FIG. 14 is a transparent perspective view showing an internal structure of the filter apparatus according to the second example embodiment of the present invention.

FIG. 14 is a transparent perspective view showing an internal structure of filter apparatus 100F in the second example embodiment. Filter apparatus 100F is configured such that a capacitor electrode PC55 and a via VG55 are added to filter apparatus 100 in the first example embodiment shown in FIG. 3. Description of elements in FIG. 14 the same or substantially the same as those in FIG. 3 will not be repeated.

Referring to FIG. 14, via VG55 is connected in or substantially in the center of plate electrode PC30. Via VG55 extends from plate electrode PC30 toward lower surface 112 and is connected to capacitor electrode PC55 arranged as being opposed to ground electrode PG1. Capacitor C41 in FIG. 13 includes capacitor electrode PC55 and ground electrode PG1. When multilayer body 110 is viewed in the plan view from the layering direction, capacitor electrode PC55 and via VG55 are covered with plate electrode PC30.

A portion from via V12 to via VG55 in plate electrode PC30 corresponds to inductor L41 in FIG. 13. A portion from via V22 to via VG55 in plate electrode PC30 corresponds to inductor L42 in FIG. 13. Via VG55 corresponds to inductor L43 in FIG. 13.

Figure 15:
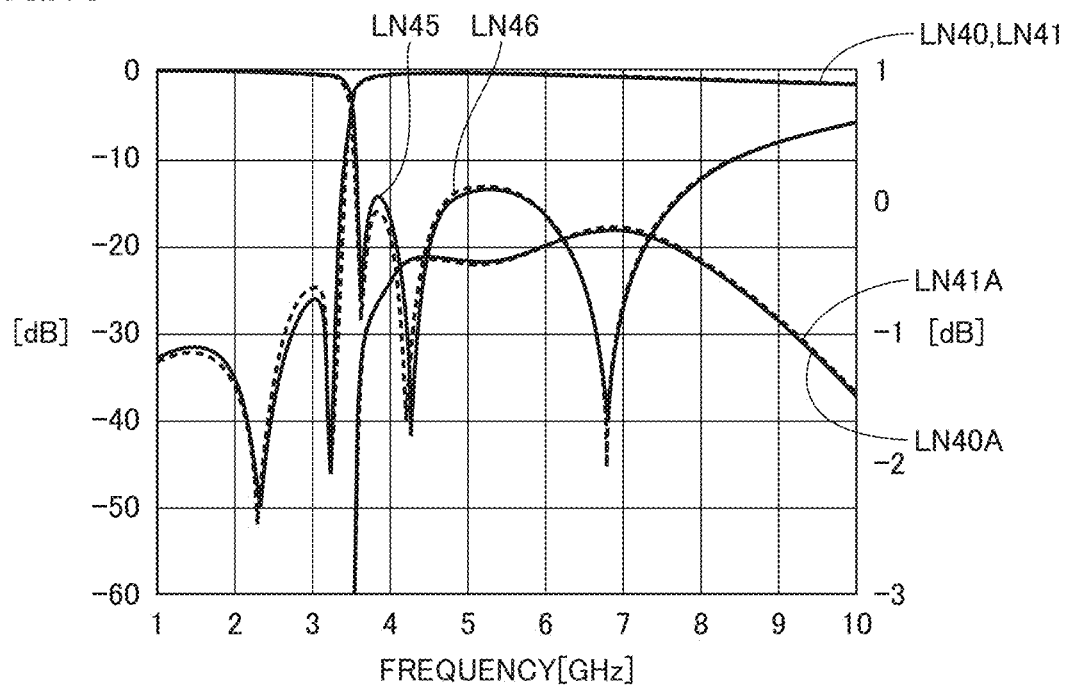
FIG. 15 is a diagram for illustrating influence on pass characteristics depending on presence or absence of the external shield electrode in the filter apparatus according to the second example embodiment of the present invention.

FIG. 15 is a diagram for illustrating influence on pass characteristics depending on presence or absence of the external shield electrode in filter apparatus 100F in the second example embodiment. In FIG. 15, the abscissa represents a frequency and the ordinate represents an insertion loss (solid lines LN40 and LN40A and dashed lines LN41 and LN41A) and a return loss (a solid line LN45 and a dashed line LN46). Solid lines LN40, LN40A, and LN45 represent characteristics in the absence of the external shield electrode, whereas dashed lines LN41, LN41A, and LN46 represent characteristics when the external shield electrode comes closer.

As shown in FIG. 15, it can be seen that, in filter apparatus 100F in the second example embodiment, the insertion loss and the return loss when the external shield electrode comes closer to upper surface 111 are the same or substantially the same as those in the absence of the external shield electrode. Therefore, the configuration of filter apparatus 100F also can reduce or prevent lowering in pass characteristics caused by the external shield electrode.

"Via VG55" in the second example embodiment corresponds to the "fifth line" in the present disclosure. "Capacitor electrode PC55" in the second example embodiment corresponds to the "sixth capacitor electrode" in the present disclosure.

Sixth Modification

In a sixth modification, a configuration in which an LC series resonator in filter apparatus 100F in the second example embodiment is connected in a reverse orientation will be described.

Figure 16:
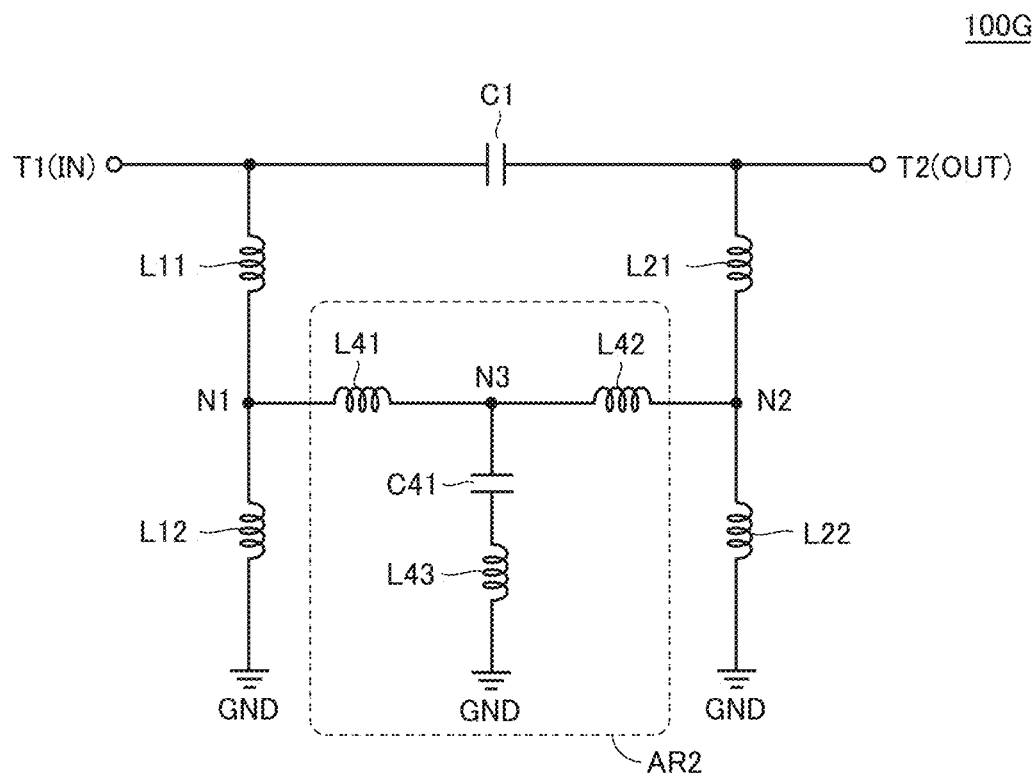
FIG. 16 is an equivalent circuit diagram of a filter apparatus according to a sixth modification of an example embodiment of the present invention.

FIG. 16 is an equivalent circuit diagram of a filter apparatus 100G according to the sixth modification. In filter apparatus 100G, capacitor C41 in the equivalent circuit of filter apparatus 100F in the second example embodiment shown in FIG. 13 is connected to connection node N3 and inductor L43 in the equivalent circuit is connected between capacitor C41 and ground terminal GND (an area AR2 shown with a dashed line).

Figure 17:
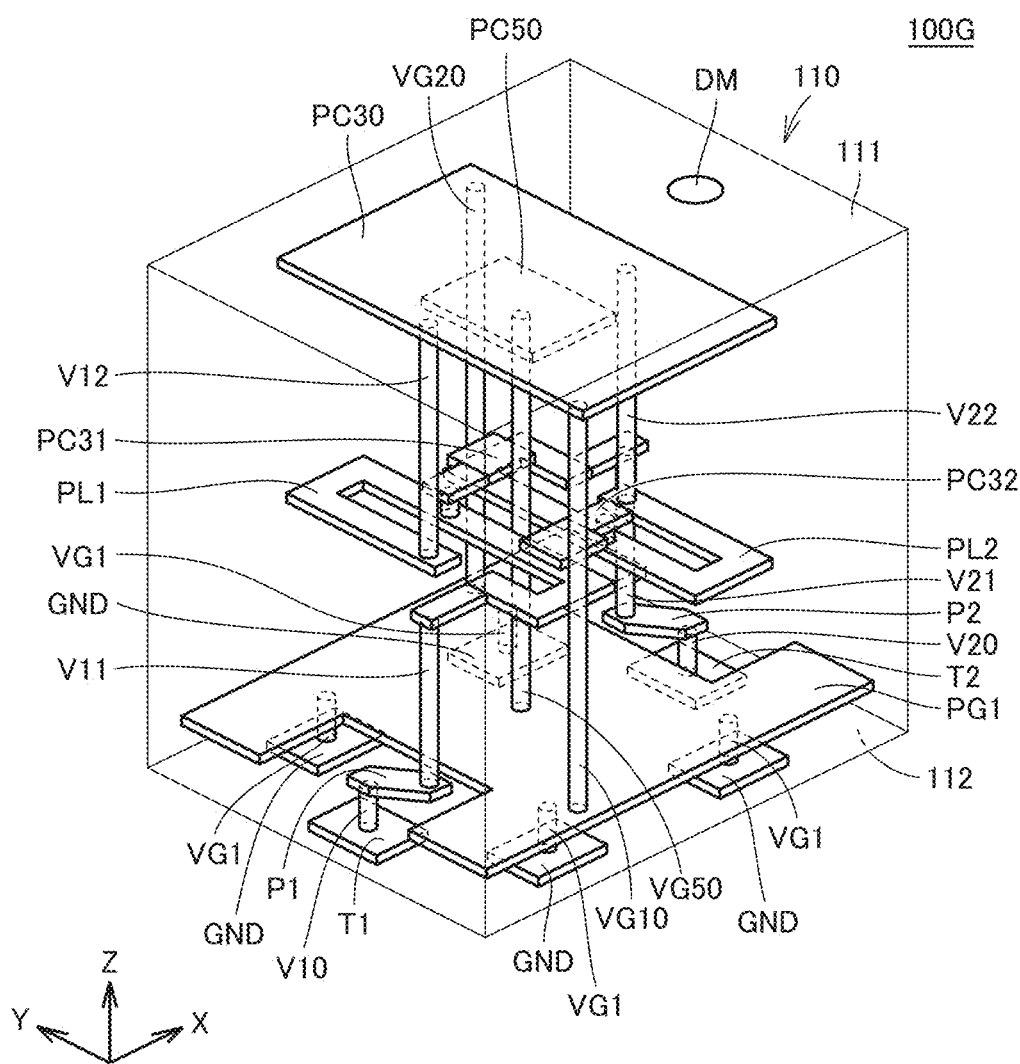
FIG. 17 is a transparent perspective view showing an internal structure of the filter apparatus according to the sixth modification.

FIG. 17 is a transparent perspective view showing an internal structure of filter apparatus 100G in the sixth modification. Filter apparatus 100G is provided with a capacitor electrode PC50 and a via VG50 instead of capacitor electrode PC55 and via VG55 in filter apparatus 100F in FIG. 14.

Capacitor electrode PC50 is opposed to plate electrode PC30 in a dielectric layer between plate electrode PC30 and ground electrode PG1. Capacitor electrode PC50 is connected to ground electrode PG1 through via VG50. When multilayer body 110 is viewed in the plan view from the layering direction, capacitor electrode PC50 and via VG50 are covered with plate electrode PC30.

Capacitor C41 in FIG. 16 includes capacitor electrode PC50 and plate electrode PC30. Via VG50 corresponds to inductor L43 in FIG. 16.

Such a configuration also can prevent lowering in pass characteristics caused by the external shield electrode, as in the second example embodiment.

"Via VG50" in the sixth modification corresponds to the "sixth line" in the present disclosure. "Capacitor electrode PC50" in the sixth modification corresponds to the "seventh capacitor electrode" in the present disclosure.

Seventh Modification

In a seventh modification, a configuration in which an LC series resonator as in the second example embodiment is added to filter apparatus 100C in the third modification shown in FIG. 10 will be described.

Figure 18:
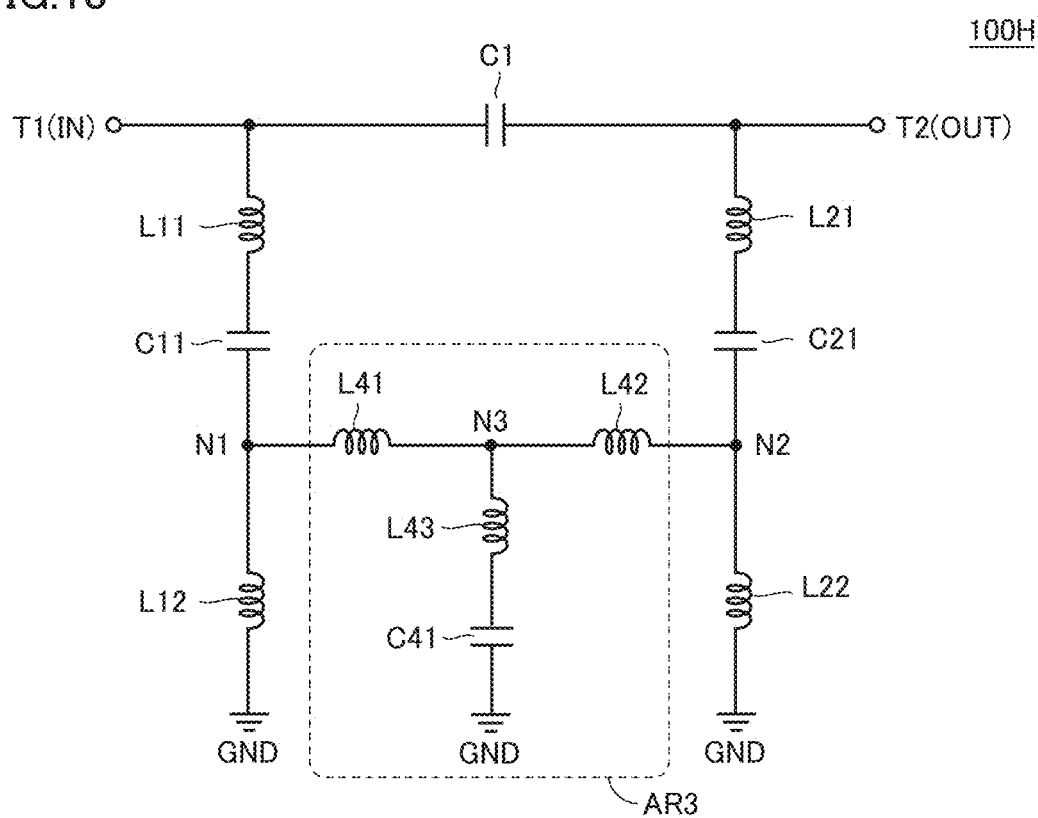
FIG. 18 is an equivalent circuit diagram of a filter apparatus according to a seventh modification of an example embodiment of the present invention.

FIG. 18 is an equivalent circuit diagram of a filter apparatus 100H according to the seventh modification. The equivalent circuit in FIG. 18 is configured such that a portion of inductor L1 in the equivalent circuit shown in FIG. 6 is replaced with a circuit shown as an area AR3 with a dashed line. In other words, inductors L41 and L42 connected in series are connected between connection node N1 and connection node N2, and the LC series resonator including inductor L43 and capacitor C41 is connected between connection node N3 and ground terminal GND, connection node N3 being between inductors L41 and L42.

Figure 19:
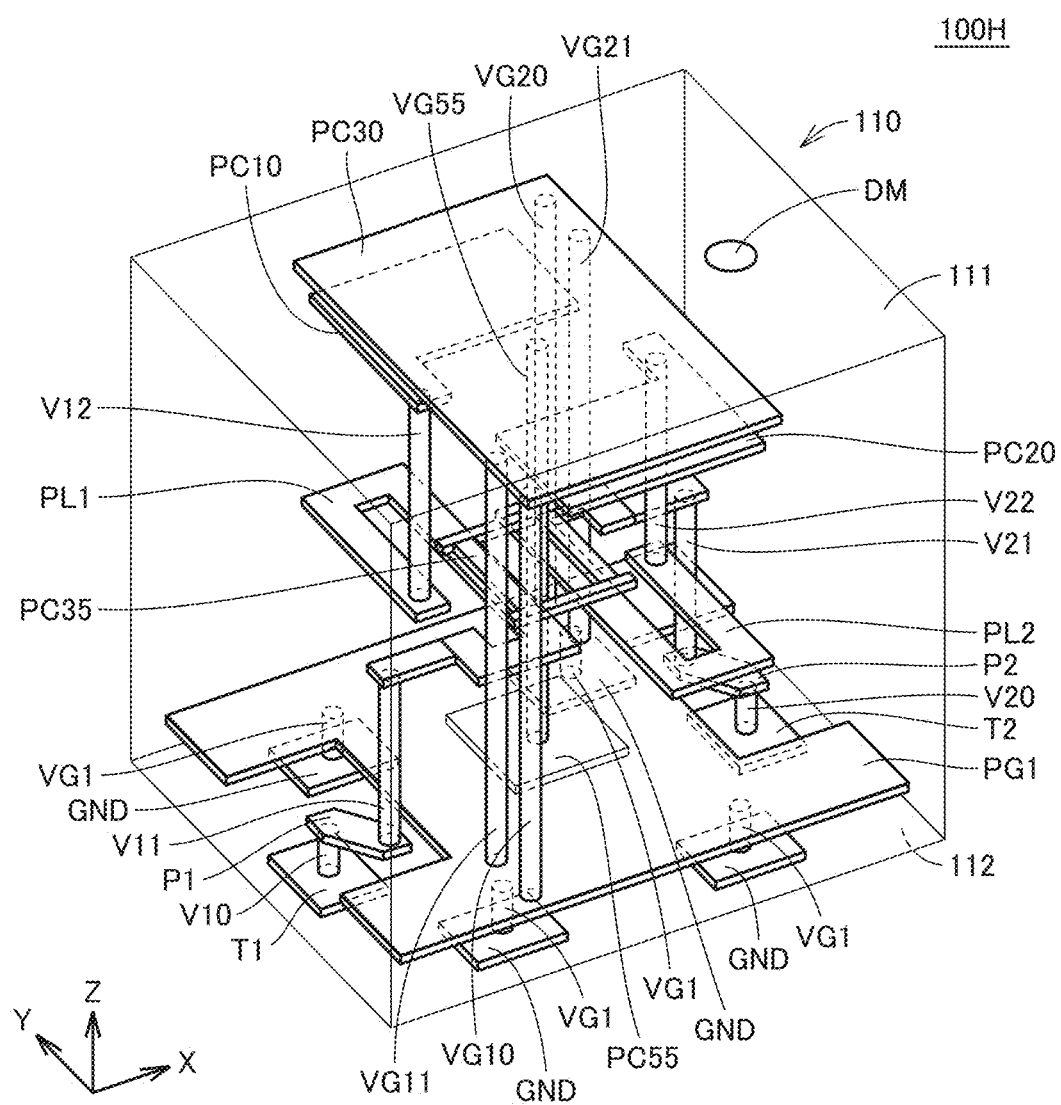
FIG. 19 is a transparent perspective view showing an internal structure of the filter apparatus according to the seventh modification.

FIG. 19 is a transparent perspective view showing an internal structure of filter apparatus 100H in the seventh modification. Filter apparatus 100H is configured such that capacitor electrode PC55 and vias VG55, VG21, and VG22 are added to the configuration of filter apparatus 100C shown in FIG. 10. Description of elements in FIG. 19 the same as those in FIG. 10 will not be repeated.

Referring to FIG. 19, via VG55 is connected in or substantially in the center of plate electrode PC30. Via VG55 extends from plate electrode PC30 toward lower surface 112 and is connected to capacitor electrode PC55 opposed to ground electrode PG1. Capacitor C41 in FIG. 18 includes capacitor electrode PC55 and ground electrode PG1. When multilayer body 110 is viewed in the plan view from the layering direction, capacitor electrode PC55 and via VG55 are covered with plate electrode PC30.

The portion from via V11 to via VG55 in plate electrode PC30 corresponds to inductor L41 in FIG. 18. The portion from via V21 to via VG55 in plate electrode PC30 corresponds to inductor L42 in FIG. 18. Via VG55 corresponds to inductor L43 in FIG. 18.

Via VG11 is positioned adjacently to via VG10 and connected to plate electrode PC30 and ground electrode PG1. Similarly, via VG21 is positioned adjacently to via VG20 and connected to plate electrode PC30 and ground electrode PG1. Vias VG11 and VG21 are provided to lower inductance values of inductors L12 and L22 in FIG. 18, and they are not required features. As long as a desired inductance value can be achieved, only vias VG10 and VG20 may be provided.

Figure 20:
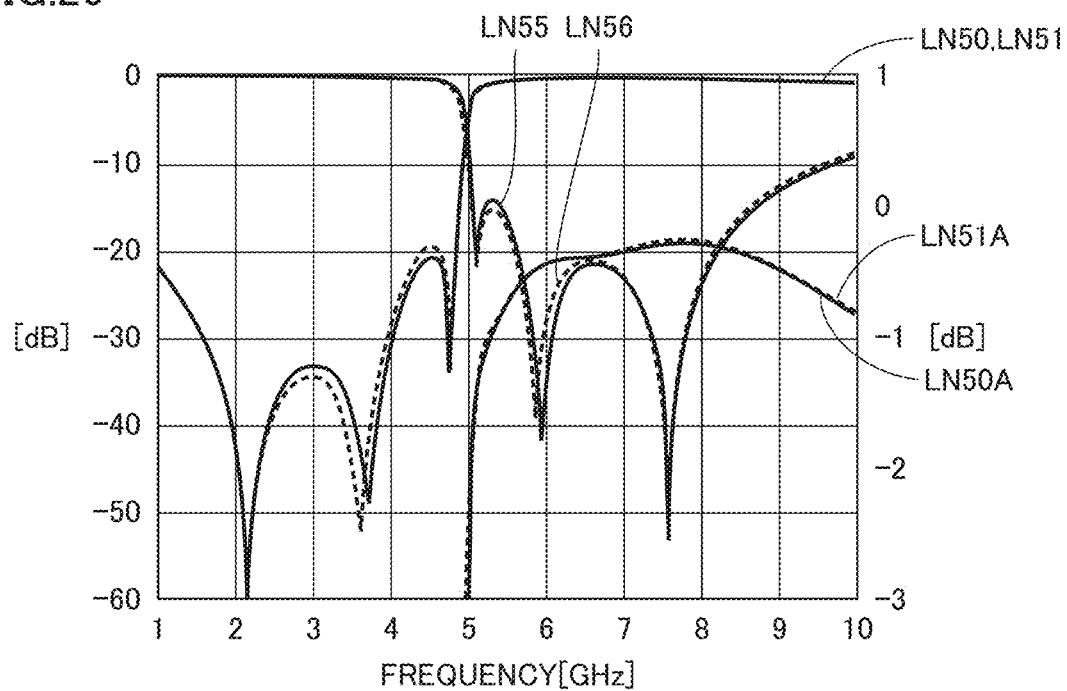
FIG. 20 is a diagram for illustrating influence on pass characteristics depending on presence or absence of the external shield electrode in the filter apparatus according to the seventh modification.

FIG. 20 is a diagram for illustrating influence on pass characteristics depending on presence or absence of the external shield electrode in filter apparatus 100H in the seventh modification. In FIG. 20, the abscissa represents a frequency and the ordinate represents an insertion loss (solid lines LN50, LN50A and dashed lines LN51 and LN51A) and a return loss (a solid line LN55 and a dashed line LN56). Solid lines LN50, LN50A, and LN55 represent characteristics in the absence of the external shield electrode, whereas dashed lines LN51, LN51A, and LN56 represent characteristics when the external shield electrode comes closer.

As shown in FIG. 20, it can be seen that, in filter apparatus 100H in the second example embodiment, the insertion loss and the return loss when the external shield electrode comes closer to upper surface 111 are the same or substantially the same as those in the absence of the external shield electrode. Therefore, the configuration of filter apparatus 100H also can prevent lowering in pass characteristics caused by the external shield electrode.

Eighth Modification

In an eighth modification, a configuration in which an LC series resonator in filter apparatus 100H in the seventh modification is connected in a reverse orientation will be described.

Figure 21:
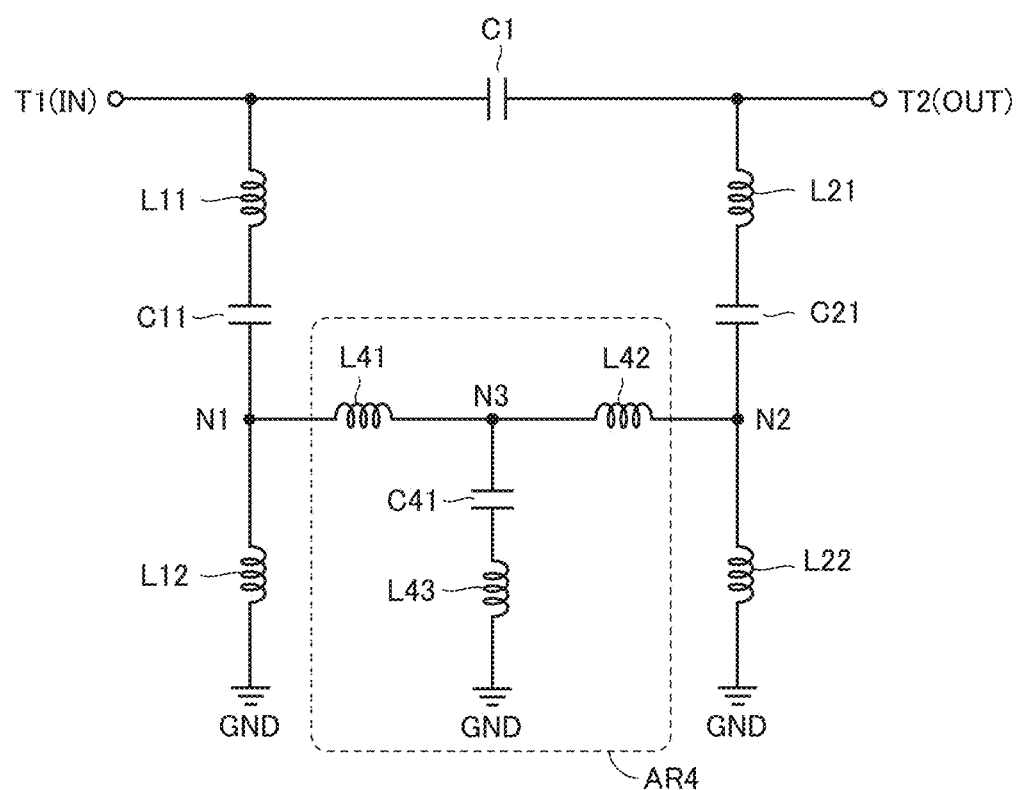
FIG. 21 is an equivalent circuit diagram of a filter apparatus according to an eighth modification of an example embodiment of the present invention.

FIG. 21 is an equivalent circuit diagram of a filter apparatus 100I according to the eighth modification. In filter apparatus 100I, capacitor C41 in the equivalent circuit of filter apparatus 100H in the seventh modification shown in FIG. 18 is connected to connection node N3 and inductor L43 in the equivalent circuit is connected between capacitor C41 and ground terminal GND (an area AR4 shown with a dashed line).

Figure 22:
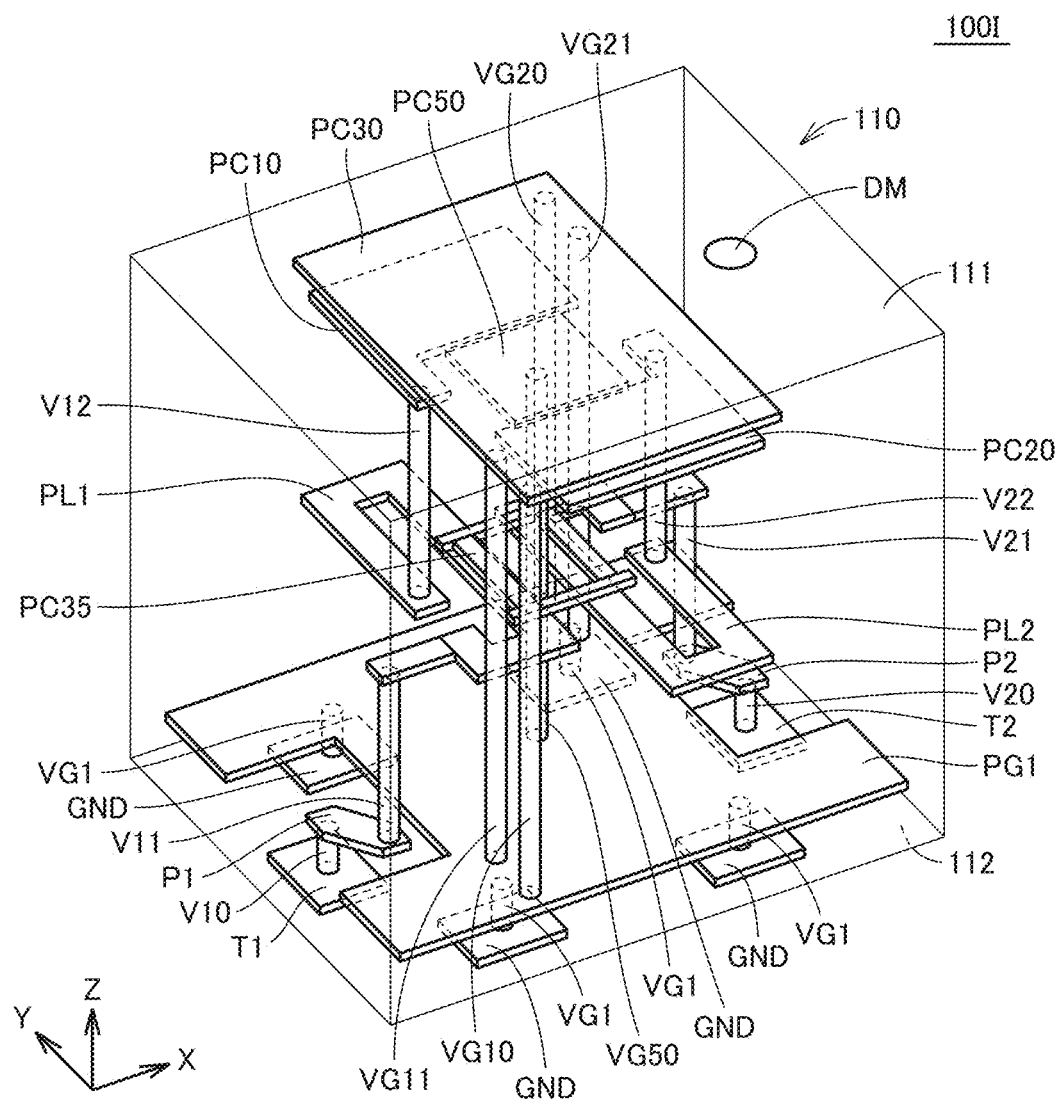
FIG. 22 is a transparent perspective view showing an internal structure of the filter apparatus according to the eighth modification.

FIG. 22 is a transparent perspective view showing an internal structure of filter apparatus 100I in the eighth modification. Filter apparatus 100I is provided with capacitor electrode PC50 and via VG50 instead of capacitor electrode PC55 and via VG55 in filter apparatus 100H in FIG. 19.

Capacitor electrode PC50 is opposed to plate electrode PC30 in a dielectric layer between plate electrode PC30 and ground electrode PG1. When multilayer body 110 is viewed in the plan view from the layering direction, capacitor electrode PC50 is provided between capacitor electrode PC10 and capacitor electrode PC20 and does not overlap with capacitor electrodes PC10 and PC20. Capacitor electrode PC50 may be provided in the same dielectric layer where capacitor electrodes PC10 and PC20 are provided or may be provided in a different dielectric layer. Capacitor electrode PC50 is connected to ground electrode PG1 through via VG50. Via VG50 passes through an opening in capacitor electrode PC35. When multilayer body 110 is viewed in the plan view from the layering direction, capacitor electrode PC50 and via VG50 are covered with plate electrode PC30.

Figure 23:
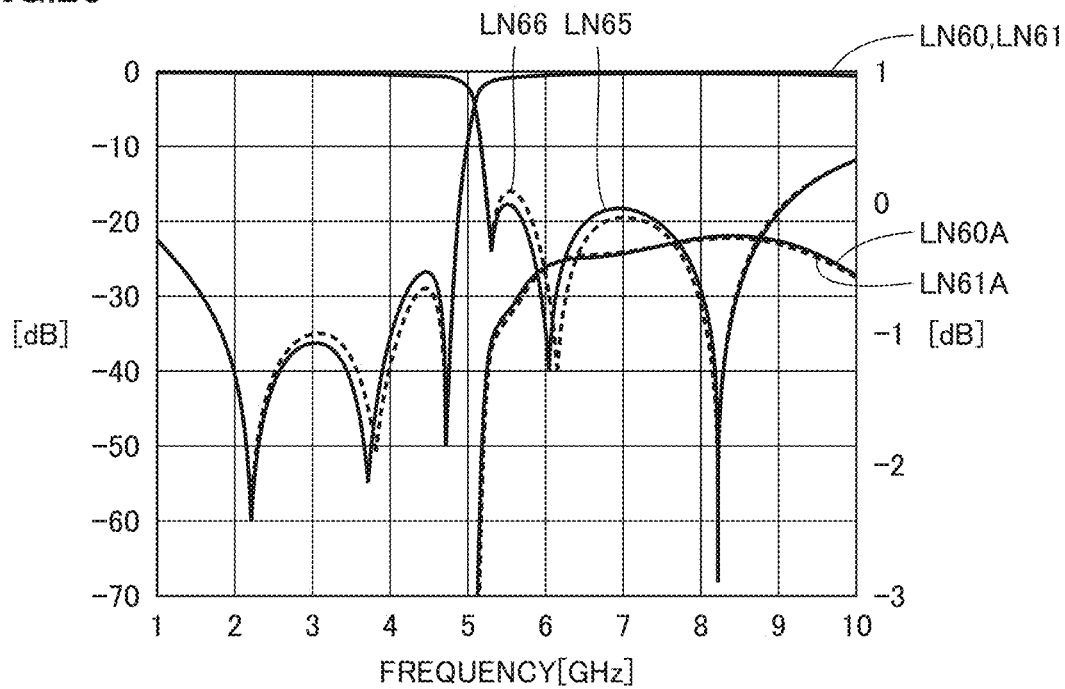
FIG. 23 is a diagram for illustrating influence on pass characteristics depending on presence or absence of the external shield electrode in the filter apparatus according to the eighth modification.

FIG. 23 is a diagram for illustrating influence on pass characteristics depending on presence or absence of the external shield electrode in filter apparatus 100I in the eighth modification. In FIG. 23, the abscissa represents a frequency and the ordinate represents an insertion loss (solid lines LN60 and LN60A and dashed lines LN61 and LN61A) and a return loss (a solid line LN65 and a dashed line LN66). Solid lines LN60, LN60A, and LN65 represent characteristics in the absence of the external shield electrode, whereas dashed lines LN61, LN61A, and LN66 represent characteristics when the external shield electrode comes closer.

As shown in FIG. 23, it can be seen that, in filter apparatus 100I in the eighth modification, the insertion loss and the return loss when the external shield electrode comes closer to upper surface 111 are the same or substantially the same as those in the absence of the external shield electrode. Therefore, the configuration of filter apparatus 100I also can prevent lowering in pass characteristics caused by the external shield electrode.

"Via VG50" in the eighth modification corresponds to the "seventh line" in the present disclosure. "Capacitor electrode PC50" in the eighth modification corresponds to the "eighth capacitor electrode" in the present disclosure.

Ninth Modification

In a ninth modification, a configuration in which capacitor electrode PC50 in filter apparatus 100I in the eighth modification is capacitively coupled to capacitor electrodes PC10 and PC20 connected to respective lines will be described.

Figure 24:
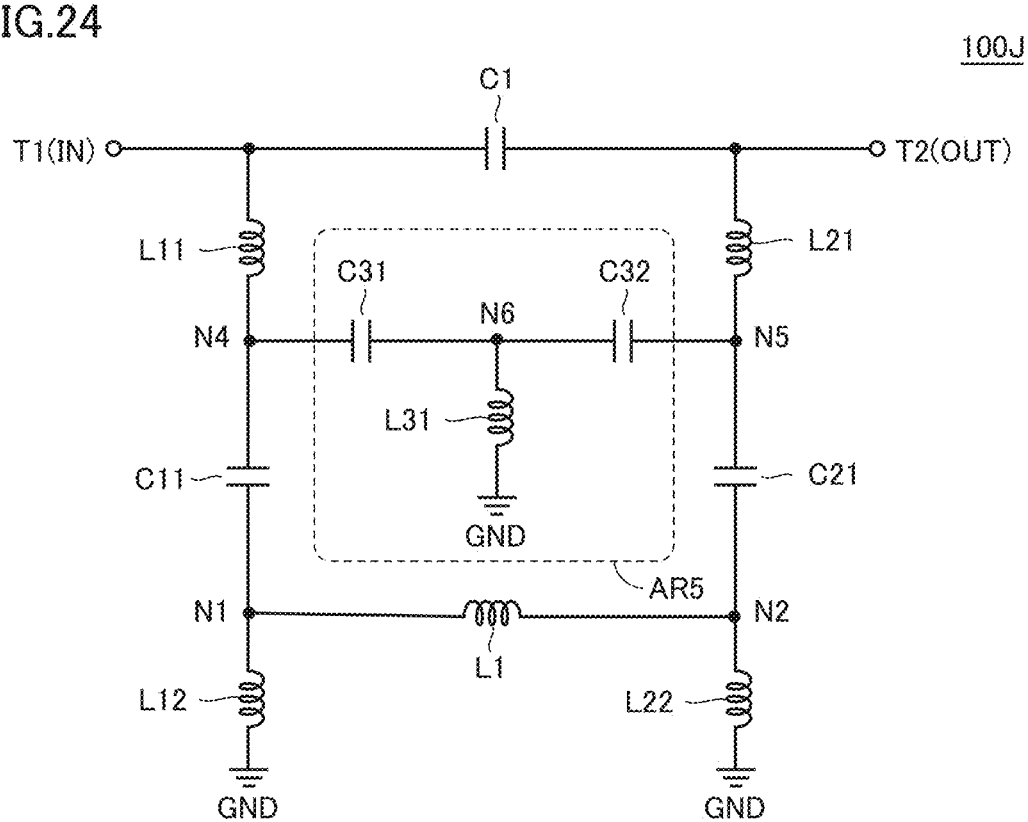
FIG. 24 is an equivalent circuit diagram of a filter apparatus according to a ninth modification of an example embodiment of the present invention.

FIG. 24 is an equivalent circuit diagram of a filter apparatus 100J according to the ninth modification. A circuit in an area AR5 shown with a dashed line is added between a connection node N4 and a connection node N5 in the equivalent circuit diagram shown in FIG. 6, connection node N4 being between inductor L11 and capacitor C11, connection node N5 being between inductor L21 and capacitor C21.

Specifically, capacitors C31 and C32 connected in series are connected between connection node N4 and connection node N5. An inductor L31 is connected between a connection node N6 and ground terminal GND, connection node N6 being between capacitors C31 and C32. The LC series resonator includes capacitors C31 and C32 and inductor L31.

Figure 25:
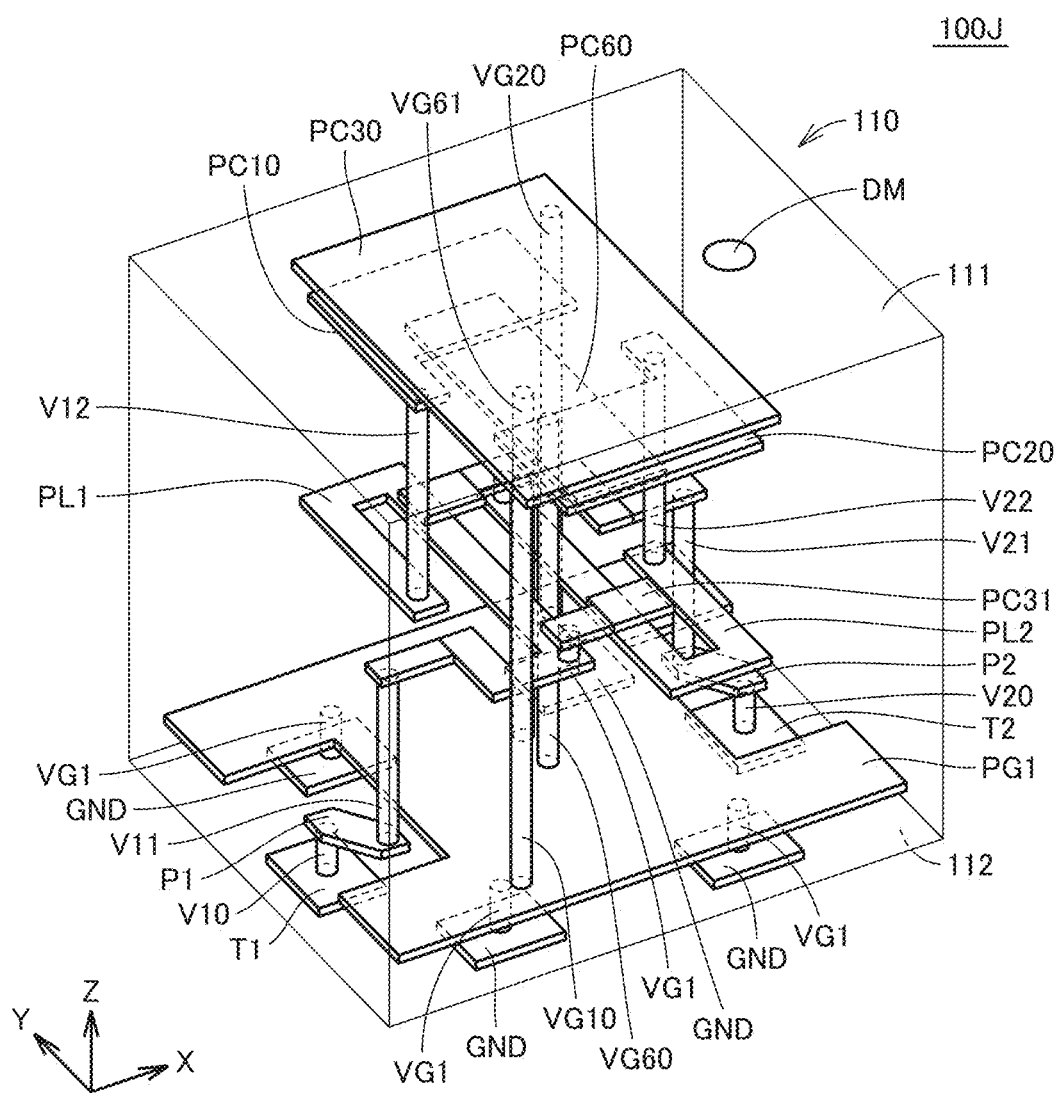
FIG. 25 is a transparent perspective view showing an internal structure of the filter apparatus according to the ninth modification.

FIG. 25 is a transparent perspective view showing an internal structure of filter apparatus 100J in the ninth modification. Filter apparatus 100J is configured such that a capacitor electrode PC60 and vias VG60 and VG61 are preferably added to filter apparatus 100A shown in FIG. 7. Description of elements in FIG. 25 the same or substantially the same as those in FIG. 7 will not be repeated.

Referring to FIG. 25, when multilayer body 110 is viewed in the plan view from the layering direction, capacitor electrode PC60 is in a rectangular or substantially rectangular shape and provided in a dielectric layer closer to lower surface 112 than capacitor electrodes PC10 and PC20. When multilayer body 110 is viewed in the plan view from the layering direction, capacitor electrode PC60 partially overlaps with capacitor electrodes PC10 and PC20. Capacitor electrode PC60 is connected to ground electrode PG1 through vias VG60 and VG61. Two vias are not necessarily required to connect between capacitor electrode PC60 and ground electrode PG1, and a single via may be provided so long as a desired inductance value can be achieved.

Capacitor C31 in FIG. 24 includes capacitor electrode PC60 and capacitor electrode PC10. Capacitor C32 in FIG. 24 includes capacitor electrode PC60 and capacitor electrode PC20.

Figure 26:
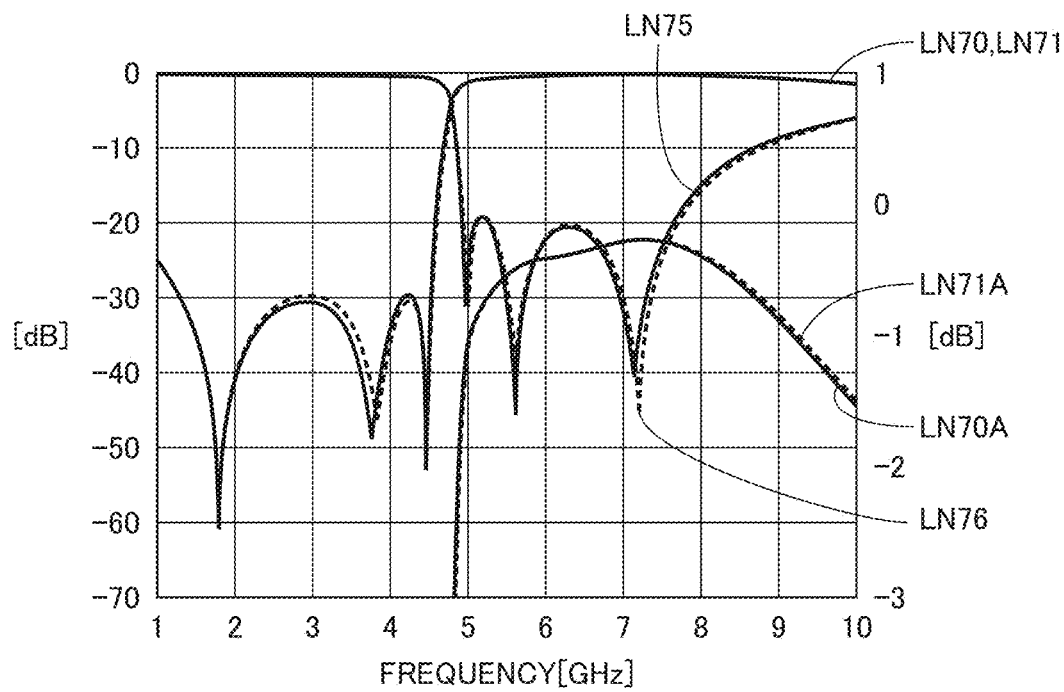
FIG. 26 is a diagram for illustrating influence on pass characteristics depending on presence or absence of the external shield electrode in the filter apparatus according to the ninth modification.

FIG. 26 is a diagram for illustrating influence on pass characteristics depending on presence or absence of the external shield electrode in filter apparatus 100J in the ninth modification. In FIG. 26, the abscissa represents a frequency and the ordinate represents an insertion loss (solid lines LN70 and LN70A and dashed lines LN71 and LN71A) and a return loss (a solid line LN75 and a dashed line LN76). Solid lines LN70, LN70A, and LN75 represent characteristics in the absence of the external shield electrode, whereas dashed lines LN71, LN71A, and LN76 represent characteristics when the external shield electrode comes closer.

As shown in FIG. 26, it can be seen that, in filter apparatus 100J in the ninth modification, the insertion loss and the return loss when the external shield electrode comes closer to upper surface 111 are the same or substantially the same as those in the absence of the external shield electrode. Therefore, the configuration of filter apparatus 100J also can prevent lowering in pass characteristics caused by the external shield electrode.

"Vias VG60 and VG61" in the ninth modification correspond to the "seventh line" in the present disclosure. "Capacitor electrode PC60" in the ninth modification corresponds to the "eighth capacitor electrode" in the present disclosure.

Illustrative example embodiments and modifications thereof described above are understood by a person skilled in the art as specific examples of aspects below.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter apparatus comprising:
a multilayer body including a plurality of dielectric layers that are layered, the multilayer body including a first surface and a second surface;
an input terminal, an output terminal, and a ground terminal provided on the second surface;
a ground electrode connected to the ground terminal;
a plate electrode provided closer to the first surface than to the ground electrode;
a first line electrically connected to the input terminal and the plate electrode;
a second line electrically connected to the output terminal and the plate electrode;
a third line and a fourth line connecting the plate electrode and the ground terminal to each other; and
a first capacitor electrode and a second capacitor electrode between the plate electrode and the second surface, and connected to the first line and the second line, respectively; wherein
the first line is capacitively coupled to the second line; and
when the multilayer body is viewed in a plan view from a layering direction;
the plate electrode covers a portion of a space providing capacitive coupling between the first line and the second line;
the first capacitor electrode and the second capacitor electrode partially overlap with each other; and
the plate electrode covers the first capacitor electrode and the second capacitor electrode.

2. The filter apparatus according to claim 1, wherein when the multilayer body is viewed in the plan view from the layering direction, the first capacitor electrode and the second line partially overlap with each other.

3. The filter apparatus according to claim 1, wherein when the multilayer body is viewed in the plan view from the layering direction, the second capacitor electrode and the first line partially overlap with each other.

4. The filter apparatus according to claim 1, further comprising:
a third capacitor electrode between the plate electrode and the second surface; wherein
when the multilayer body is viewed in the plan view from the layering direction:
the third capacitor electrode partially overlaps with both of the first line and the second line; and
the plate electrode covers the third capacitor electrode.

5. The filter apparatus according to claim 1, wherein when the multilayer body is viewed in the plan view from the layering direction:
at least a portion of the first line overlaps with the second line; and
the plate electrode covers a portion where the first line and the second line overlap with each other.

6. The filter apparatus according to claim 1, further comprising:
a fourth capacitor electrode connected to the first line and opposed to the plate electrode; and
a fifth capacitor electrode connected to the second line and opposed to the plate electrode.

7. The filter apparatus according to claim 1, further comprising:
an LC series resonator between the plate electrode and the ground electrode; wherein
the LC series resonator includes:
a sixth capacitor electrode opposed to the ground electrode; and
a fifth line connected to the sixth capacitor electrode and the plate electrode.

8. The filter apparatus according to claim 1, further comprising:
an LC series resonator between the plate electrode and the ground electrode; wherein
the LC series resonator includes:
a seventh capacitor electrode opposed to the plate electrode on a side closer to the second surface than to the plate electrode; and
a sixth line connected to the seventh capacitor electrode and the ground electrode; and
when the multilayer body is viewed in the plan view from the layering direction, the plate electrode further covers the seventh capacitor electrode.

9. The filter apparatus according to claim 6, further comprising:
an LC series resonator between the plate electrode and the ground electrode; wherein
the LC series resonator further includes:
an eighth capacitor electrode closer to the second surface than to the plate electrode; and
a seventh line connected to the eighth capacitor electrode and the ground terminal; and
when the multilayer body is viewed in the plan view from the layering direction, the plate electrode further covers the eighth capacitor electrode.

10. The filter apparatus according to claim 9, wherein, when the multilayer body is viewed in the plan view from the layering direction, the eighth capacitor electrode is between the fourth capacitor electrode and the fifth capacitor electrode.

11. The filter apparatus according to claim 10, wherein the eighth capacitor electrode is provided in a same dielectric layer as the fourth capacitor electrode and the fifth capacitor electrode.

12. The filter apparatus according to claim 9, wherein, when the multilayer body is viewed in the plan view from the layering direction, the eighth capacitor electrode partially overlaps with the fourth capacitor electrode and the fifth capacitor electrode.

13. The filter apparatus according to claim 1, wherein the first line includes:
a first interconnection pattern provided in a dielectric layer in the multilayer body;
a first via that connecting the first interconnection pattern and the input terminal to each other; and
a second via that electrically connecting the first interconnection pattern and the plate electrode to each other; and
the second line includes:
a second interconnection pattern provided in a dielectric layer in the multilayer body;
a third via that connecting the second interconnection pattern and the output terminal to each other; and
a fourth via that electrically connecting the second interconnection pattern and the plate electrode to each other.

14. The filter apparatus according to claim 1, wherein
the first and second capacitor electrodes are included in a plurality of capacitor electrodes;
the plurality of capacitor electrodes at least partially define at least one capacitor;
the at least one capacitor includes a capacitor connected between the input terminal and the output terminal;
the first line, the second line, the third line, and the fourth line are included in a plurality of lines;
the plurality of lines at least partially define a plurality of inductors;
the plurality of inductors include inductors connected in series between the input terminal and the ground terminal; and
the plurality of inductors include additional inductors connected in series between the output terminal and the ground terminal.

15. The filter apparatus according to claim 14, wherein the plurality of inductors include a bridge inductor including a first end connected between a pair of the inductors and a second end connected between a pair of the additional inductors.

16. The filter apparatus according to claim 1, wherein
each of the input terminal, the output terminal, and the ground terminal are flat plate electrodes; and
the ground terminal includes a plurality of ground terminals arranged along two long sides on the second surface.

17. The filter apparatus according to claim 1, wherein
the plate electrode has a C shape or substantially a C shape when viewed in the plan view from the layering direction; and
the ground electrode is in an H shape or substantially in an H shape when viewed in the plan view from the layering direction.

18. The filter apparatus according to claim 1, wherein
the first and second capacitor electrodes are included in a plurality of capacitor electrodes;
the plurality of capacitor electrodes at least partially define at least one capacitor;
the at least one capacitor includes a capacitor connected between the input terminal and the output terminal;
the first line, the second line, the third line, and the fourth line are included in a plurality of lines;
the plurality of lines at least partially define a plurality of inductors;
the plurality of inductors include first inductors connected in series with a first additional capacitor between the input terminal and the ground terminal; and
the plurality of inductors include second inductors connected in series with a second additional capacitors between the output terminal and the ground terminal.

19. The filter apparatus according to claim 1, wherein
the first and second capacitor electrodes are included in a plurality of capacitor electrodes;
the plurality of capacitor electrodes at least partially define at least one capacitor;
the at least one capacitor includes a capacitor connected between the input terminal and the output terminal;
the first line, the second line, the third line, and the fourth line are included in a plurality of lines;
the plurality of lines at least partially define a plurality of inductors;
the plurality of inductors include first inductors connected in series between the input terminal and the ground terminal;
the plurality of inductors include second inductors connected in series between the output terminal and the ground terminal;
the plurality of inductors include third inductors connected in series between a pair of the first inductors and a pair of the second inductors; and
the plurality of inductors include a fourth inductor connected between a pair of the third inductors and the ground terminal.

* * * * *